(12) United States Patent
Mazumder et al.

(10) Patent No.: US 8,294,078 B2
(45) Date of Patent: Oct. 23, 2012

(54) OPTICALLY-TRIGGERED MULTI-STAGE POWER SYSTEM AND DEVICES

(75) Inventors: Sudip K. Mazumder, Chicago, IL (US); Tirthajyoti Sarkar, Chicago, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 1007 days.

(21) Appl. No.: 12/157,694

(22) Filed: Jun. 11, 2008

(65) Prior Publication Data
US 2009/0026967 A1    Jan. 29, 2009

Related U.S. Application Data

(63) Continuation-in-part of application No. 11/922,185, filed on Jan. 10, 2008, now Pat. No. 8,183,512.

(60) Provisional application No. 60/934,107, filed on Jun. 11, 2007.

(51) Int. Cl.
H03K 17/78 (2006.01)
G01J 1/44 (2006.01)
H04N 3/14 (2006.01)

(52) U.S. Cl. ............. 250/214 SW; 250/214 R; 348/308

(58) Field of Classification Search ........... 250/214 SW, 250/214 LS, 214 A, 214 LA, 214 C, 214 R; 257/113–118, 146, 157, 291, 292; 327/427, 327/752, 355, 358, 359; 348/307–309
See application file for complete search history.

(56) References Cited

U.S. PATENT DOCUMENTS

| | | | |
|---|---|---|---|
| 4,626,884 A | 12/1986 | Shannon | |
| 4,835,409 A | 5/1989 | Bhagwat et al. | |
| 5,214,275 A | 5/1993 | Freeman et al. | |
| 5,237,633 A * | 8/1993 | Gaw et al. | 385/14 |
| 5,270,251 A * | 12/1993 | Cohen | 438/467 |
| 5,444,729 A | 8/1995 | Chung | |
| 5,450,430 A * | 9/1995 | Chung | 372/38.03 |
| 5,535,001 A | 7/1996 | Tajima | |
| 5,550,939 A | 8/1996 | Rodgers | |
| 5,554,882 A * | 9/1996 | Falk | 257/605 |
| 5,596,522 A | 1/1997 | Ovshinsky | |
| 5,663,580 A * | 9/1997 | Harris et al. | 257/77 |
| 5,754,714 A | 5/1998 | Suzuki | |

(Continued)

FOREIGN PATENT DOCUMENTS

WO    WO 2007/002603    1/2007

OTHER PUBLICATIONS

U.S. Appl. No. 11/922,185, filed Dec. 12, 2007, Mazumder.

(Continued)

*Primary Examiner* — Georgia Y Epps
*Assistant Examiner* — Don Williams
(74) *Attorney, Agent, or Firm* — Greer, Burns & Crain Ltd.

(57) ABSTRACT

A multi-stage optically-triggered power system. At least one triggering stage is responsive to at least one optical trigger to directly create photogeneration of carriers in the at least one triggering stage and thus generate at least one output signal. At least one main power device stage coupled to the at least one triggering stage is responsive to the at least one generated output signal to activate the at least one main power device stage. The at least one triggering stage and the at least one main power device stage may be monolithically integrated.

35 Claims, 19 Drawing Sheets

U.S. PATENT DOCUMENTS

| | | | |
|---|---|---|---|
| 6,154,477 A | 11/2000 | Weidenheimer | |
| 6,218,682 B1 | 4/2001 | Zucker et al. | |
| 6,541,752 B2* | 4/2003 | Zappa et al. | 250/214.1 |
| 6,681,079 B1* | 1/2004 | Maroney | 398/15 |
| 7,227,280 B2* | 6/2007 | Zucker et al. | 307/117 |

OTHER PUBLICATIONS

Buttram, M., "Some Future Directions for Repetitive Pulsed Power", *Science*, vol. 1, 2001, pp. 3-8.

Chang, S.J. et al., "400nm InGaN and InGaN/AlGaN multiquantam well light-emitting diodes", *IEEE*, 2003, pp. 91-94.

Davydov. V.Y. et al., "Absorption and Emission of Hexagonal InN. Evidence of Narrow Fundamental Band Gap", *Phys. Stat. Sol.* (b), vol. 229, No. 3, 2002, pp. R1-R3.

Davydov, V.Y. et al., Band Gap of InN and In-Rich $In_xGa_{1-x}N$ alloys (0.36<x<1), *Phys. Stat. Sol.*, (b). vol. 230, No. 2, 2002, R4-R6.

Domen, K., "Lasing Mechanism of InGaN-GaN-AlGaN MQW Laser Diode Grown on SiC by Low-Pressure Metal-Organic Vapor Phase Epitaxy". *IEEE Journal of Selected Topics in Quantum Electronics*, vol. 4, No. 3, May/Jun. 1998, pp. 490-497.

Fischer, S. et al., "Properties of GaN grown at high rates on sapphire and on 6H-SiC", *Appl. Phys. Lett.*, vol. 69, No. 18, Oct. 28, 1996, pp. 2716-2718.

Gradinaru, G. et al., "A Review on the Breakdown Limitation of Photoconductive Semiconductor Power Switches", $9^{th}$ IEEE International Pulsed Power Conference, vol. 2, 1993, pp. 645-649.

Kipshidze, G. et. al., "High Quality AlN and GaN Grown on Compliant Si/SiC Substrates by Gas Source Molecular Beam Epitaxy", *Journal of Electronic Materials*, vol. 30, No. 7, 2001, pp. 825-828.

Mazzola, M.S. et. al., "Nanosecond optical quenching of photoconductivity in bulk GaAs switch", *Appl. Phys. Lett.*, vol. 55, No. 20, Nov. 13, 1989, pp. 2102-2104.

Mukai, T., "Recent Progress in Group-III Nitride Light-Emitting Diodes", *IEEE Journal on Selected Topics in Quantum Electronics*, vol. 8, No. 2, Mar./Apr. 2002, pp. 264-270.

Nakamura, S., "InGaN-Based Blue Laser Diodes", *IEEE Journal of Selected Topics in Quantum Electronics*, vol. 3, No. 3, Jun. 1997, pp. 712-718.

Neudeck, P. et al., "High-Temperature Electronics—A Role for Wide Bandgap Semiconductors?", *Proceedings of the IEEE*, vol. 90, No. 6, Jun. 2002, pp. 1065-1076.

Peterkin, F.E. et. al., "Studies of Breakdown in Photoconductive GaAs Switches", *Conference Record of the $21^{st}$ International Power Modulator Symposium*, 1994, pp. 112-115.

Shi, W. et. al., "High Gain Lateral Semi-Insulating GaAs Photoconductive Switch Triggered by 1064 nm Laser Pulses", *Chin. Phys. Lett.*, vol. 19, No. 3 (2002) pp. 351-354.

Stout, D.C. et. al., "Investigation of a Laser-Controlled, Copper-Doped GaAs Closing and Opening Switch for Pulsed Power Applications", $8^{th}$ *IEEE Pulsed Power Conference*, 1991, pp. 41-44.

Stout, Phillip J. et al., "Modeling of High Power Semiconductor Switches Operated in the Nonlinear Mode," *J. Appl. Phys.*, vol. 79, No. 4, Feb. 15, 1996, pp. 2084-2090.

Wetzel, C. et al., "GaN epitaxial layers grown on 6H-SiC by the sublimation sandwich technique", *Appl. Phys. Lett.*, vol. 65, No. 8, Aug. 22, 1994, pp. 1033-1035.

Zutavern, F. et. al., "Properties of High Gain GaAs Switches for Pulsed Power Applications", $11^{th}$ *IEEE International Pulsed Power Conference*, vol. 2, 1997, pp. 959-964.

\* cited by examiner

OPTICALLY-TRIGGERED MULTI-STAGE POWER SYSTEM AND DEVICES

PRIORITY CLAIM AND REFERENCE TO RELATED APPLICATION

This application claims the benefit of U.S. Provisional Application Ser. No. 60/934,107, filed Jun. 11, 2007, under 35 U.S.C. §119. U.S. Provisional Application Ser. No. 60/934,107 is incorporated in its entirety by reference herein.

This application is a continuation-in-part of U.S. application Ser. No. 11/922,185, filed Jan. 10, 2008 now U.S. Pat. No. 8,183,512, entitled "OPTICALLY-TRIGGERED POWER SYSTEM AND DEVICES", which is incorporated by reference herein.

STATEMENT OF GOVERNMENT INTEREST

This invention was made with Government assistance under Air Force Research Laboratory Grant No. FA8650-05-M-2553 and Office of Naval Research Grant No. N00014-06-1-0227. The Government has certain rights in this invention.

FIELD OF THE INVENTION

The invention relates to power electronics, and more particularly to optically-triggered power devices for power electronic systems.

BACKGROUND OF THE INVENTION

Next-generation photonic power electronic systems based on optically-triggered devices (OTDs) provide key advantages over conventional, electrically-triggered devices (ETD) based switching power systems. For example, optical switching enhances the possibility of system integration by reducing the problems associated with electromagnetic-interference (EMI) effects. Further, for an optically-triggered (OT) converter, designs of high- and low-side drivers can remain the same, yielding simple design, enhanced reliability, and monolithic integration. By contrast, for two- and higher-level electrically-triggered (ET) switching converters, different designs of low- and high-side drivers are required; the latter is especially difficult to design for medium and high-power applications. Optical triggering also provides the possibility of optically modulating (by varying the properties of the optical signal for example intensity, wavelength, etc.) the radiated/conducted electromagnetic signature of a power electronics system. Optical triggering further provides possibility of controlling the efficiency of the power electronics system dynamically. Additionally, owing to the direct photogeneration, which introduces very short delay, optical triggering enables synchronized operation of series/parallel connected array of power devices. This may enable creating series/parallel connected switch assembly for scaling up the voltage blocking or current carrying capability, which is, otherwise, not possible with a single power device in existing technology.

Additionally, unlike an OTD, as the switching frequency of an ETD increases, parasitic oscillations may be induced in the driver circuit owing to coupling effects because of the device capacitance and the parasitic inductance of the gate connection, and to transmission-line effects. Also, in an OTD, there is complete isolation between the gate driver and the power stage. As such, very high di/dt and dv/dt, which cause significant reliability problems in an ETD at a high switch frequency, have no impact on an OTD. Therefore, the basic architecture of the gate driver in an OTD is simple. Still further, an OTD-based converter does not suffer from gate-driver failure due to short-circuiting.

Additionally, recent research has shown that tangible reductions in weight, volume, and cost are possible through an application of emerging photonic technologies for air, land, or sea based vehicle power management systems, such as those based on fly-by-light (FBL) architecture. An electrically isolated flight control mode based on photonic technology could provide a lightweight, EMI resistant system.

However, to realize such photonic power electronics, device technologies, that address several key issues, are needed. One such issue is wavelength of operation from the standpoint of trade-off between cost, optical absorption and technical complexity of the optical source. Another issue is electrical gain. To reduce the power requirements, volume, and weight of the optical triggering source, high electrical (device) gain and quantum efficiency are desirable. A further issue is switching speed. A fast turn-on and turn-off of the OTD along with low on resistance is needed to efficiently support high-frequency repetitive switching in power electronics. A low-loss rapid switching capability also enhances the power density of the power system, which is desirable for most applications. Yet another issue is high-temperature operability. High-temperature operability is often required to address the robustness of the power converter and high power density.

Light-triggered thyristors and optothyristors are two known examples of photoconductive power devices designed for power electronics. However, both of these known devices feature an inherent thyristor-like latch-up problem, leading to uncontrollable and slow turn-off, which is not desirable for a fast repetitive switching device.

Moreover, vertical devices like optothyristors employ a semi-insulating thick layer instead of a controllably doped layer. This results in a large voltage drop across the device during conduction. For switching devices in power electronic applications, this drop is unacceptable from an efficiency point of view, and the voltage-sustaining layer must be doped controllably so as to maintain an optimum balance between on-state conduction drop and off-stage voltage blocking capability.

SUMMARY OF THE INVENTION

Embodiments of the present invention provide, among other things, a multi-stage optically-triggered power system. The system comprises at least one triggering stage that is responsive to at least one optical trigger to directly create photogeneration of carriers in the at least one triggering stage and thus generate at least one output signal. At least one power device coupled to the at least one triggering stage is responsive to the at least one generated output signal to activate the at least one power device.

Example embodiments of the present invention can have one or a plurality of such triggering stages, power devices, and combination of output signals, and can accept one or a plurality of optical triggers.

In an additional embodiment of the present invention, a monolithically integrated power device is provided. The power device comprises at least one triggering stage responsive to at least one optical trigger to directly create photogeneration of carriers in the at least one triggering stage and thus generate at least one output signal. At least one main power device is coupled to the at least one triggering stage and responsive to the at least one generated output signal to activate the at least one power device. The at least one triggering stage and the at least one main power device are monolithically integrated into the power device.

BRIEF DESCRIPTION OF THE DRAWINGS

FIG. 15A shows a first stage sensitive to long wavelength, and FIG. 15B shows a first stage sensitive to short wavelength;

FIG. 16A shows first and second stages having the same voltage potential across the terminals, and FIG. 16B shows first and second stages having different voltage potential across the terminals;

FIG. 21A shows insulator-filled trenches grown on an insulator thin film, and FIG. 21B shows a reverse-biased P-N junction made from a higher bandgap material;

DETAILED DESCRIPTION

Figure 1:
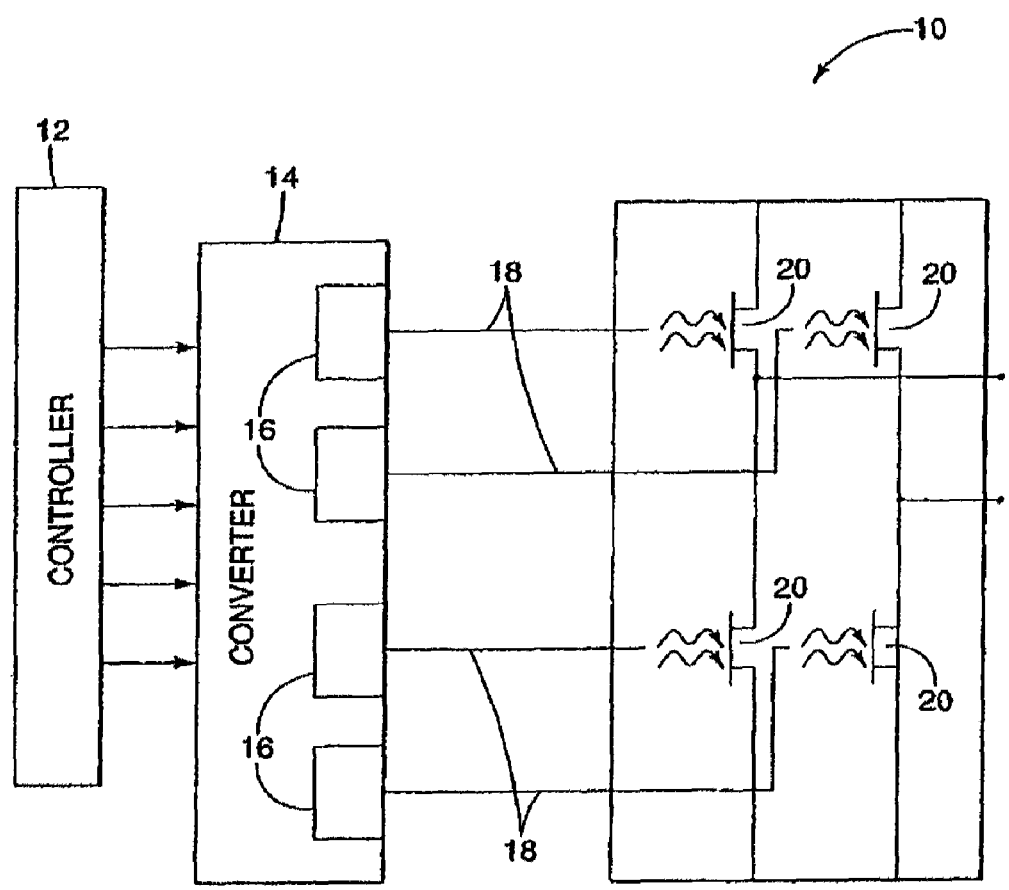
FIG. 1 is a block diagram of a direct optically-triggered power electronic system in accordance with an embodiment of the present invention.

There are examples of known methods related to optical controlling of power devices. However, conventional methods do not provide direct optical control (where the photogenerated carriers control the conduction properties of the power device) for power electronics application. In particular conventional methods, optical drivers employ photodiode based structures as the optically activated element. There is room for improvement in that aspect by designing transistor based structures with internal gain to further reduce optical triggering power requirement. For all of these technologies, the optically-triggered element acts only as a control signal detecting element and therefore cannot modulate the dynamics or steady-state properties of the power device and therefore cannot control the properties of overall power electronics system either by optical modulation. Providing this modulation capability is a significant aim of particular embodiments of the present invention.

Embodiments of the present invention provide, among other things, a multi-stage optically-triggered power system. Broadly, a power system refers to a power processing device or system, or group, array, and/or network of power processing devices or systems, that receives at least one input from one or more energy sources and feeds one or more application loads. The power system includes at least one first or triggering stage, which broadly refers to a device or part of a device that in response to at least one optical signal, referred to as an optical trigger herein, generates at least one output signal for activating at least one second (or subsequent) stage, referred to as a main power device stage or main power device. An optical trigger is any optical signal that can be received to initiate photogeneration. Nonlimiting examples of optical triggers are generated from a laser, a light-emitting diode (LED), or other sources. The optical trigger may be generated by, as a nonlimiting example, a converter that converts electrical control signals to optical control signals. The power system can have one or a plurality of such triggering stages, power devices, and combination of output signals and can accept one or a plurality of optical triggers.

The triggering stage is responsive to the at least one optical trigger to directly create photogeneration of carriers in the triggering stage and accordingly generate at least one output signal. An output signal is any signal that can be generated by the triggering device to activate the main power device, and may include electrical signals, optical signals, or others. A main power device stage may be, as nonlimiting examples, a bipolar junction transistor, metal-insulator-semiconductor transistor, junction field effect transistor, thyristor, silicon controlled rectifier, insulated gate bipolar transistor, etc. The at least one main power device stage is coupled to the at least one triggering stage (for example, by a suitable electrical or optical coupling), and is responsive to the at least one generated output signal to activate the power device.

By configuring the power system in this way, the triggering stage(s) can be selected and/or configured, alone or in combination with the main power device stage(s), to provide scalability of optical-triggered operation for the power system. Further, the triggering stage, being optically activated, can be used in combination with any of various main power stages to provide a hybrid power system. The use of multiple stages with the first stage being optically triggered provides a cascading power system, which can be optimized for many situations and requirements.

In other example embodiments of the present invention, a power device is provided, which includes at least one triggering stage responsive to at least one optical trigger to directly create photogeneration of carriers in the triggering stage and thus generate at least one output signal. At least one main power device stage (main power device) is coupled to the at least one triggering stage and responsive to the output signal to activate the power device. The at least one triggering stage and the at least one main power device are monolithically integrated into the power device.

Though it is possible to physically separate the main power device stage and the triggering stage in some example embodiments of the present invention as provided herein, other embodiments monolithically integrate the stages. Example power systems and devices herein incorporate separate and/or monolithically integrated stages to provide various embodiments.

Embodiments of the present invention employ photogeneration (i.e., generation of electron-hole pairs by shining light of a suitable wavelength on a semiconductor) and recombination mechanism to trigger a power semiconductor device from off-state to on-state and vice versa, without any electrical signal applied to the device's controlling gate terminal. This precludes the need to have an electrical gate terminal. As the photogeneration is an instantaneous process, an almost zero delay between the shining of light and initiation of device turn-on results. The turn-off speed is primarily governed by the recombination lifetime of the photogenerated carriers.

Using primary device materials of very short lifetime, such as GaAs, fast repetitive switching capability by reducing both turn-on and turn-off time can be achieved. Advantages over conventional designs are provided in particular embodiments by integrating optically active nature of a III-V compound semiconductor, e.g., GaAs, to a P-N junction based power device structure and thus triggering a switching power semiconductor device through direct optical control using one or more optical sources of monochromatic wavelength.

Preferred embodiments will now be discussed with respect to the drawings. The drawings include schematic figures that are not to scale, which will be fully understood by skilled artisans with reference to the accompanying description. Features may be exaggerated for purposes of illustration. From the preferred embodiments, artisans will recognize additional features and broader aspects of the invention.

Turning now to FIG. 1, a direct optically-triggered power electronic system 10 in accordance with an embodiment of the present invention includes a controller 12 for outputting electrical control signals. A converter 14 receives the electrical control signals from the controller 12 and converts then into optical signals (light signals). The electrical or optical signals may be, for example, variable/constant frequency and/or pulse width/pulse amplitude. The converter 14 includes a number of optical drivers, such as laser or light-emitting diode (LED) drivers 16 for generating the optical signals having the same or different wavelengths and same or different intensities. The optical signals from the converter 14 are then carried by optical waveguides such as optical fibers 18 to optically-triggered power devices 20, which operate or trigger when the optical signals are received.

In an example embodiment, the controller 12 is an electronic circuit that generates suitable timing signals for controlling the turn-on and turn-off of the power devices 20 in the power electronics system 10. The controller 12 receives information on the electrical state of the power electronics system 10 (e.g., voltage at different nodes, current through different branches of the circuit) through suitable sensors and processes that information to generate the control signals.

The converter may be, as a nonlimiting example, a semiconductor laser diode, which accepts input electrical current signals and generates output light pulses accordingly. It may also be, for example, a light-emitting diode, or a multi-stage device, such as a solid-state laser system pumped by a laser diode. In the latter case, the laser diode accepts the input electrical signals, and converts them to optical signals, which are fed to the solid-state laser. The solid-state laser then generates the final output optical signals. Nevertheless, the example overall converter takes input electrical signals and generates output optical signals following the input signals.

Figure 2:
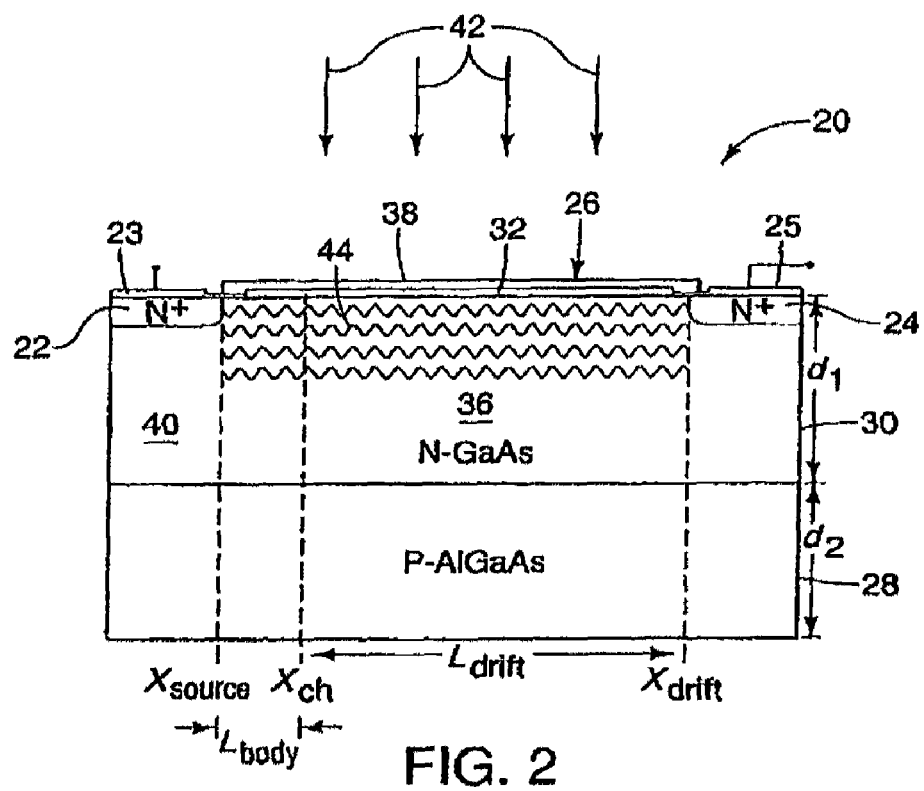
FIG. 2 is an optically-triggered power device in accordance with one embodiment of the present invention.
Figure 3:
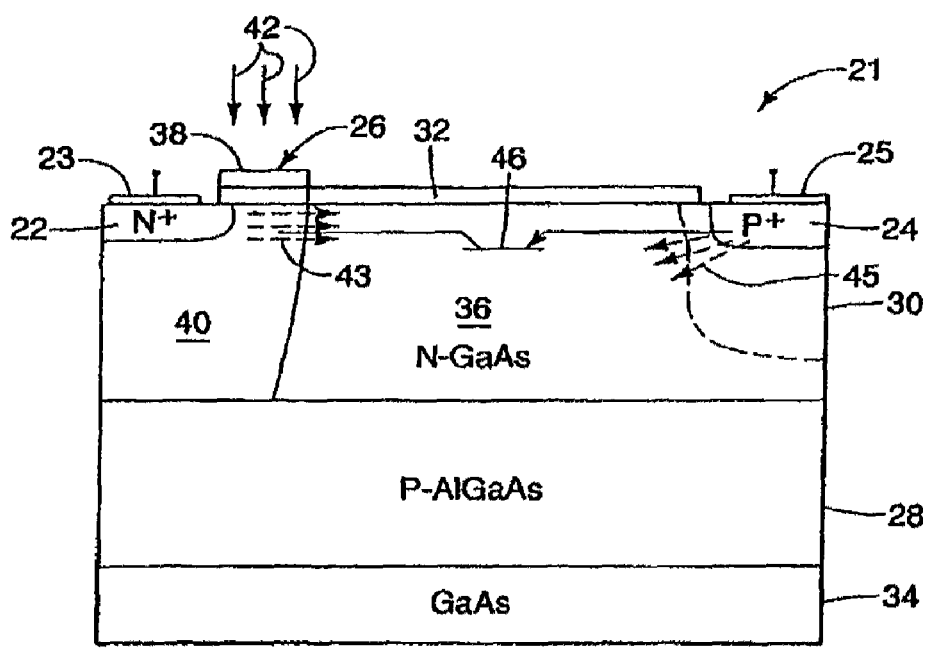
FIG. 3 is an optically-triggered power device in accordance with another embodiment of the present invention.

Referring to FIGS. 2 and 3, optically-triggered power devices 20 and 21 include two electrical terminals 23, 25 attached respectively to a source region, and a drain region 24, and an optical window 26. The power devices 20 also include epitaxial layers of a P-type layer 28 of AlGaAs, an N-type layer 30 of GaAs, and an N—AlGaAs surface barrier layer 32 (in the optical window 26) from the bottom respectively grown on top of the semi-insulating GaAs substrate 34 (shown in FIG. 3).

GaAs was chosen as the primary device material because of its direct bandgap nature, higher mobility, and fast photogeneration-recombination dynamics. The doping and thickness values of these layers have been chosen to realize the superjunction charge-balance; i.e., the total positive charge contributed by the P-type layer 28 nullifies the total negative charge contributed by the N-type layers 30 on top of it. This ensures complete depletion of a drift region 36 formed by the GaAs N-type layer 30, and makes the breakdown voltage of the power devices 20, 21 linearly dependent on the drift length $L_{drift}$. In the blocking or open state, the applied voltage is supported by the reverse biased P-N junction between a P-body region 40 and the N-drift region 36.

The source and the drain regions 22, 24 below the terminals 23, 25 are highly-doped areas. For the power device 20 such as an optically-triggered power transistor (OTPT) (FIG. 2), both are N⁺ type, and for the power device 21 such as an optically-gated bipolar transistor (OGBT) (FIG. 3), the source region 22 is an N⁺ type and the drain region 24 is a P⁺ type. These regions 22, 24 inject the carriers (electrons and holes) into their respective power devices 20, 21 from the circuit (not shown) through the electrical contacts (that is, the terminals 23, 25).

The optical window 26, in the embodiment shown in FIG. 2, includes an anti-reflecting layer 38 between the electrodes, preferably made of suitable dielectric material, such as SiN, of particular thickness, e.g., approximately 100 nm thick, that results in minimum amount of reflection of light. The diffused P-body region 40 of the power device 20 is realized by a zinc diffusion method, and creates an almost parallel-plate-like junction with the N-drift region 36. The thin AlGaAs surface barrier layer 32 is used to suppress Fermi-pinning effects and surface recombination velocity effects, which may otherwise degrade the overall device performance, lowering the optical triggering efficiency. The AlGaAs surface barrier layer 32, being transparent to the operating wavelength of the optical signals, does not cause photogeneration.

When triggering light 42 shines on the optical window 26, the conduction starts by photogeneration in the P-body region 40. For the power device 20 such as the OTPT shown in FIG. 2, the optical window 26 spreads over the drift length $L_{drift}$ between the drain and source regions 24, 22, and photogenerated carriers electrically connect the terminals 21, 23 via a conducting channel 44. When the triggering light 42 shuts off, photogenerated carriers recombine, and the channel 44 ceases to turn the power device 20 off.

For the power device such as the OGBT 21 shown in FIG. 3, the optical window 26 only covers the region around the P-body region 40, and photogenerated electrons 43 act as the base current for the lateral P-N-P transistor 46 to turn the device on. The forward biased P-N junction on the drain region 24 side of the power device 20 injects holes 45 into the drift region 36 that modulates its conductivity and starts current conduction; that is, the holes 45 start a process called "optically-initiated conductivity modulation". When the light shuts off, the base current to the P-N-P transistor ceases due to recombination, and the power device 40 shuts off.

This additional carrier injection by the P-N-P transistor 46 helps to achieve gain for the OGBT type power device 21. The optical window 26 needs to cover only the P-body region 40 to create a photogenerated channel to supply electrons. This is unlike the OTPT type power device 20, where direct photogenerated carriers help to build the device current without any additional electrical gain. This makes OTPT turn-on very fast, limited only by laser driver 16 (shown in FIG. 1) trigger rise time. For the OGBT type power device 21, the hole injection from the P⁺ drain region 24 builds up the primary device current, but this introduces a delay, and the turn-on becomes slower. Turn-off for both the devices is limited by the recombination lifetime, which is around approximately 1-10 ns for moderately doped GaAs.

Figure 4:
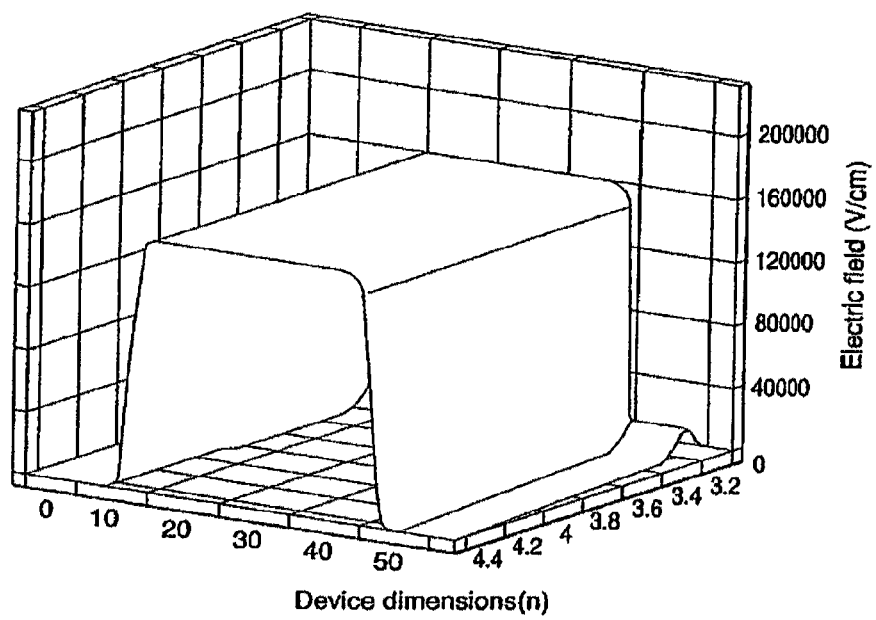
FIG. 4 is a diagram showing a two-dimensional electric field distribution inside an optically-triggered power device at the instant of breakdown.
Figure 5:
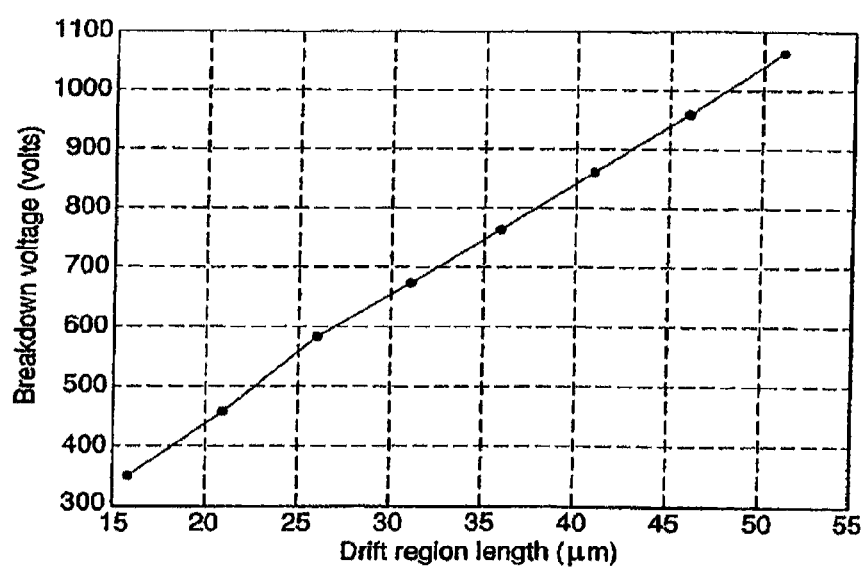
FIG. 5 is a chart showing the linear dependence of the blocking voltage with the length of a drift region when super-junction charge-balance condition is satisfied.

FIG. 4 shows the two-dimensional electric field distribution inside the OTPT power device 20 at the instant of breakdown, while FIG. 5 demonstrates the linear dependence of the blocking voltage with the length of the drift region $L_{drift}$ when superjunction charge-balance condition is satisfied by proper device design. The breakdown electric field is shown to be approximately 200-250 kV/cm. The flatness of the field in the entire drift region $L_{drift}$ indicates complete depletion of this region by charge-balance.

Figure 6:
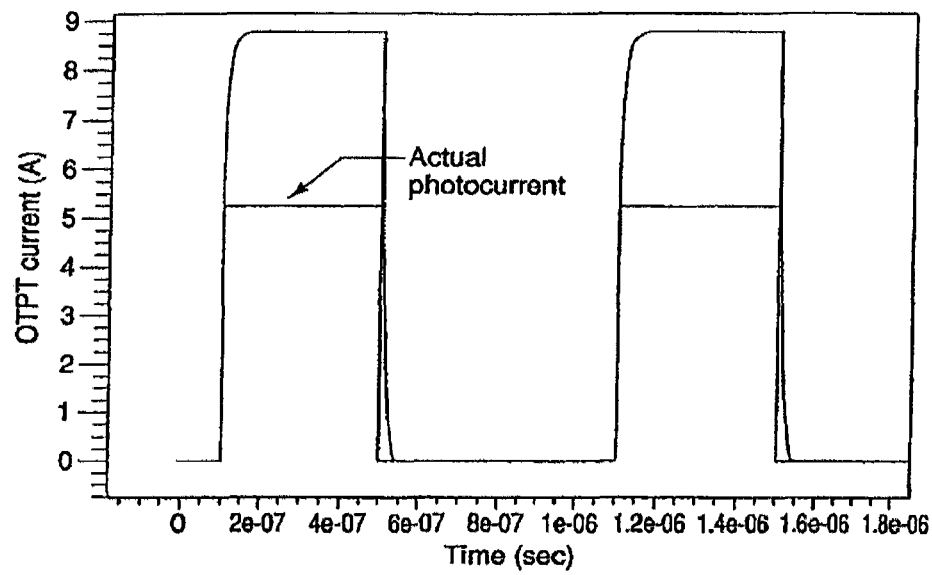
FIGS. 6 and 7 are charts showing switching results of optically-triggered power devices according to embodiments of the present invention.
Figure 7:
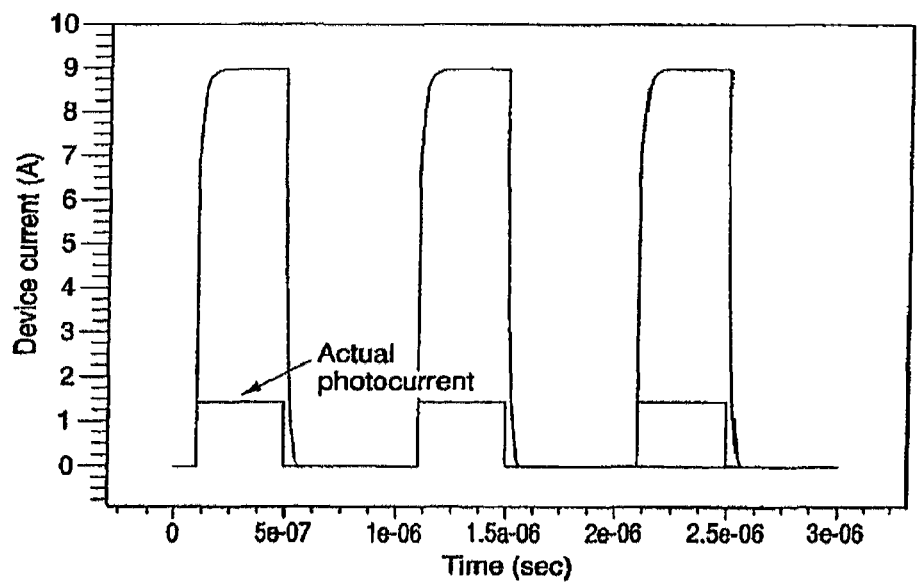

FIGS. 6 and 7 show the switching results (with a triggering wavelength of 808 nm) for the OTPT and OGBT type power devices 20, 21. These figures show that both of these devices are "latch-free" devices; that is, turning off the triggering light source ensures turn-off of the device. While for the OTBT power device 20 the current gain is slightly higher than 1, the OGBT power device 21 exhibits higher gain but at the price of slower turn-on compared to OTPT.

Superjunction charge-balance in the OTPT type power device 20, for example, ensures flat electric field in the completely depleted drift region 36 (see FIG. 4) at the instant of breakdown. This enhances the breakdown voltage for the same device area and thus keeps specific on-state resistance low. The following charge-balance condition needs to be satisfied for the highest breakdown voltage, $$d_1 N_1 + d_{cap} N_{cap} = d_2 N_2 \qquad (1)$$

If the superjunction condition is satisfied by controlling the thickness and doping density of the epitaxial layers, then the breakdown voltage becomes almost independent of GaAs linear doping. Further, the breakdown voltage becomes a linear function of the length of the drift region 36 (FIG. 5) and can be extended indefinitely by increasing the drift length. Deviation from the optimum condition, however, may result in a decrease in the breakdown voltage. Sensitivity studies show that the decrease in breakdown voltage varies with the percentage charge-imbalance. Positive (negative) imbalance denotes more P(N)-type charge than N(P)-type charge.

For commercial vertical power MOSFETs, the relation between $V_{Br}$ and $R_{on,sp}$, i.e., the "silicon limit", is given by $$R_{on,sp} \propto V_{Br}^{2.5} \qquad (2)$$

For OTPT, for example, physics-based analyses yield two transcendental equations, which couple $V_{Br}$ and $R_{on,sp}$ through the common quantity $L_{drift}$. They are as follows:

$$\int_0^{L_{drift}} \left[ \begin{array}{l} 2.994 \times 10^5 \exp(-(6.648 \times 10^5 L_{drift}/V_{Br})^{1.6}) + \\ 2.215 \times 10^5 \exp(-(6.57 \times 10^5 L_{drift}/V_{Br})^{1.75}) \end{array} \right] dx = 1 \qquad (3)$$

$$R_{on,sp} = (L_{drift} + L_{body} + 2L_{electrode}) \qquad (4)$$

$$\left[ \frac{\left[ \left( \frac{1}{D_a \tau_a} + \frac{C_d N_{body}}{D_a} \right) \sqrt{\left( \frac{\mu_a}{D_a} E \right)^2 + 4 \left( \frac{1}{D_a \tau_a} + \frac{C_d N_{body}}{D_a} \right)} \right]}{(L_{body} + L_{drift})}{2 \int_0^{d_1} q [G_n(y) + C_d n_i^2](K_1 m_2 - K_2 m_1) \mu_a \, dy} \right]$$

Equation (3) is obtained from the avalanche breakdown condition and GaAs impact ionization model. Equation (4) is obtained by the solution of one-dimensional charge-continuity equation. The common coupling term is $L_{drift}$. In equation (4), $K_1$ and $K_2$ are constants that depend on doping density boundary conditions, and $m_1$ and $m_2$ are given by $$m_1, m_2 = \frac{-\left( \frac{\mu_a}{D_a} E \right) \pm \sqrt{\left( \frac{\mu_a}{D_a} E \right)^2 + 4 \left( \frac{1 + \tau_a C_d N_{body}}{D_a \tau_a} \right)}}{2} \qquad (5)$$

The photogeneration rate $G_n$ in equation (4) is given by $$G_n(y, t) = G_p(y, t) = \eta(1-R)\frac{P(t)\lambda}{hc}\alpha e^{-\alpha y} \qquad (6)$$

where h and c denote Planck's constant and velocity of light, respectively. Because of the coupling between equations (3) and (4) and dependence of $R_{on,sp}$ on $G_n$ (which is a function of P), the $R_{on}$ vs. $V_{Br}$ curve can be modulated with varying P. This modulation is similar to direct optically-controlled power devices like OTPT, and has no analogue in ETDs. While equations (4) and (5) have been derived with respect to the OTPT type power device 20, it should be understood that these equations can be similarly derived for any lateral structure power devices, including the OGBT type power device 21. The lateral structure as used herein is a power device structure in which current flows laterally between the two terminals 21 and 23; that is, parallel to the junction formed between the P-type GaAs layer 28 and the N-type GaAs layer 30.

Figure 8:
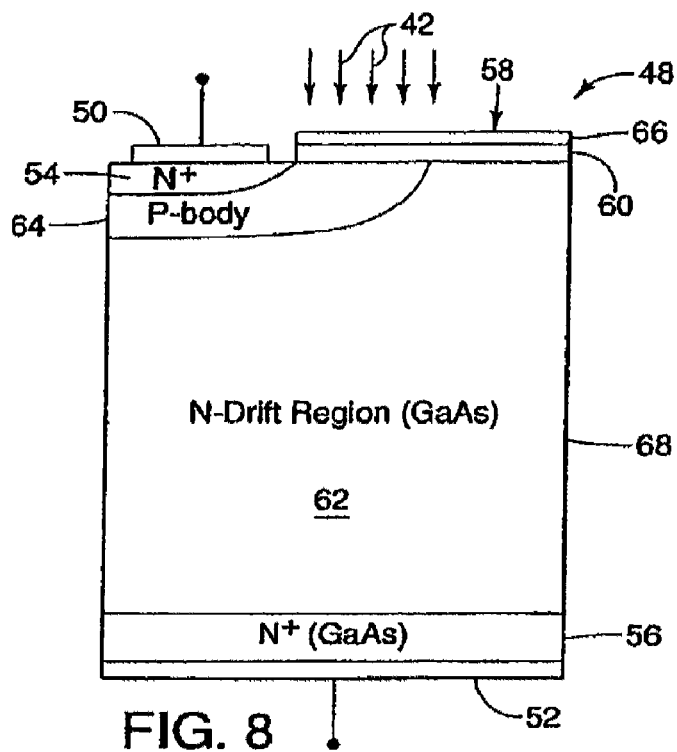
FIG. 8 is an optically-triggered power device in accordance with another embodiment of the present invention, having a vertical structure.

Turning now to FIG. 8, a power device 48 in accordance with another embodiment of the present invention includes two electrical terminals 50, 52 attached respectively to a source region 54 and a drain region 56, and an optical window 58. The power device 48 has a vertical structure in which current flows vertically between the two terminals, which are provided at the opposite sides of the power device, in contrast to power devices 20, 21 that have the terminals 23 and 25 on the same side.

As with the lateral structure power devices 20, 21, the optical window 58 also includes an N—AlGaAs surface barrier layer 60 provided substantially over an N-drift region 62 and a diffused P-body region 64. An anti-reflecting layer 66, preferably of SiN and approximately 100 nm thick, is provided over the N—AlGaAs layer 60 to minimize reflection of light incident on the anti-reflecting layer 66. The thickness of the anti-reflecting layer 66 may change depending on the optical signal wavelength and the material of at least the surface barrier layer 60.

The N-drift region 62 is provided in an epitaxial layer of GaAs 68 extending from the N—AlGaAs surface barrier layer 60 of the optical window 58 to the drain region 56. The diffused P-body region 64 is provided between the source region 54 and the GaAs layer 68, and is realized by a zinc diffusion method. The N—AlGaAs surface barrier layer 60 is used to suppress Fermi-pinning effects and surface recombination velocity effects, which may degrade the overall device performance, lowering the optical triggering efficiency. The surface barrier layer 60, being transparent to the operating wavelength of the optical signals, does not cause photogeneration.

When triggering light 42 shines on the optical window 58, electron-hole pairs are created by photogeneration in the P-body region 64. Photogenerated electrons form a channel through the P-body region 64 and connect the source region 54 conductively to the drain region 56, thereby starting a current flow between the drain region and the source region through the N-drift region 62. This places the power device 48 in an on-state. A majority of the photogenerated holes diffuse to the N$^+$ source region 54 and get recombined with excess electrons there. Some carriers undergo surface recombination also. When the triggering light 42 is removed, the electrons in the P-body region 64 get recombined quickly with the excess holes in the P-body region. The channel ceases to exist in the P-body region 64, and the device goes back to the off-state.

The vertical structure device 48, shown in FIG. 8, generally exhibits a higher gain; i.e., device current per unit photogenerated current compared to its lateral equivalent, shown in FIGS. 2 and 3. This is because the effective optical window area in the vertical structure is only $A_{opt}=ZL_{ch}$, where Z is the width of the device in the Z-dimension (along the line perpendicular to the plane of the paper) and $L_{ch}$ is the channel length. In the lateral structure, the window area is $A_{opt}=Z(L_{drift}+L_{ch})$, where $L_{drift}$ is the drift region length.

On the other hand, the lateral structure offers a parallel-plate like P-N junction, which is theoretically a good junction profile to support reverse bias, and ease of implementing superjunction (SJ) charge-balancing (by maintaining precise relation between the depth ($d_1$ and $d_2$) and doping densities ($N_1$ and $N_2$) of GaAs and AlGaAs layers by one-step epitaxial growth. This charge-balance ensures that the full drift region remains depleted regardless of its doping level and results in high breakdown voltage, which is linearly dependent on drift region length but independent of drift doping density. The SJ structure has been demonstrated to help power devices achieve higher breakdown voltage for same on-state resistance.

While the vertical structure power device 48 has been described with respect to GaAs as the primary material, other materials such as silicon carbide (SiC) and indium nitride (InN) may also be used in the vertical structure power devices. For example, the bandgap of $In_xGa_{1-x}N$ can be tailored to any value between 0.7 eV (that of pure InN) and 3.2 eV (that of pure GaN) by varying indium content. At x=0.55, the bandgap corresponding to 800-850 nm wavelength is obtained. For pure InN, 0.7-0.8 eV is obtained, which corresponds to approximately 1.55 µm wavelength, the primary niche of optical communication.

Figure 9:
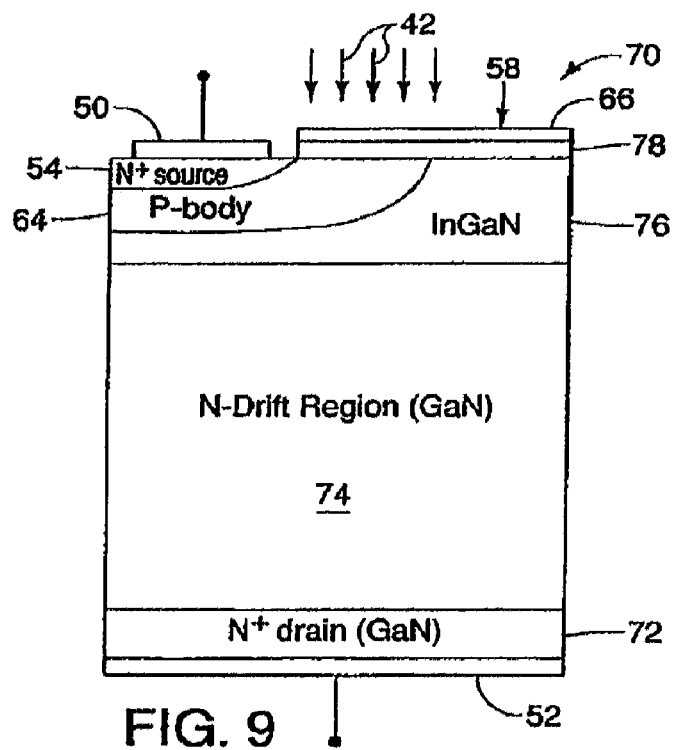
FIG. 9 shows a vertical structure power device having an $N^+$ drain region and $N^-$ drift region formed of GaN.

Examples of the vertical structure power devices having other primary materials are shown in FIGS. 9-12. The parts that are similar to those of the power device 48 are given the same reference numbers and are not described. FIG. 9 shows a vertical structure power device 70, which includes an N$^+$ drain region 72 and an N$^-$ drift region 74, both formed of GaN. Alternatively, the N$^+$ drain region 72 may be replaced with a P$^+$ drain region. The power device 70 also includes an InGaN optical absorption layer 76 provided between the drift region 74 and a GaN surface barrier layer 78, which is provided underneath the SiN anti-reflecting layer 66 of the optical window 58.

Figure 10:
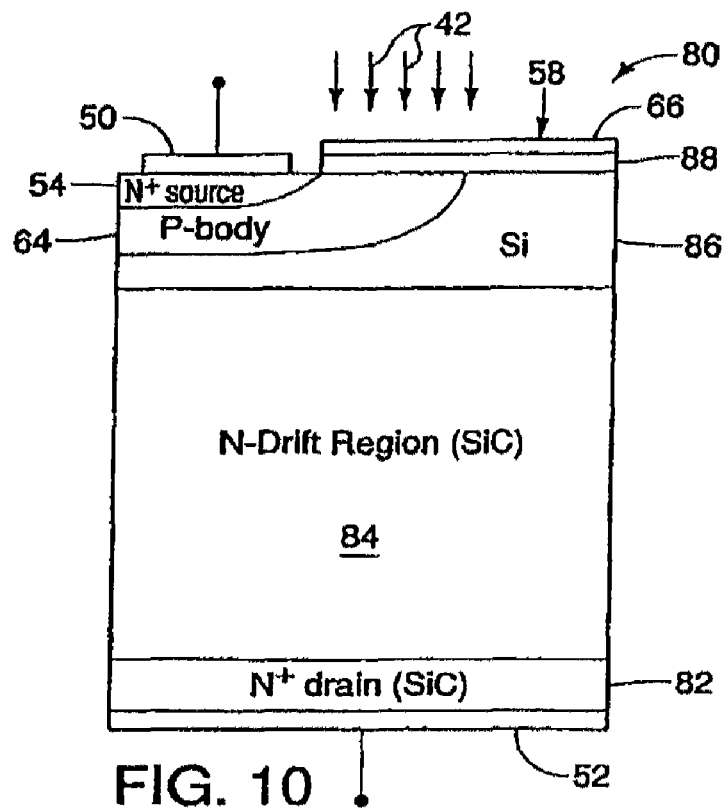
FIG. 10 shows a vertical structure power device including an $N^+$ drain region and $N^-$ drift region formed of SiC.

FIG. 10 shows a vertical structure power device 80 in accordance with another embodiment of the present invention. The power device 80 includes an N$^+$ drain region 82 and an N$^-$ drift region 84 both formed of SiC. Alternatively, the N$^+$ drain region 82 may be replaced with a P$^+$ drain region. The power device 80 also includes an Si optical absorption layer 86 provided between the drift region 84 and an SiC surface barrier layer 88, which is provided underneath the SiN anti-reflecting layer 66 of the optical window 58.

Figure 11:
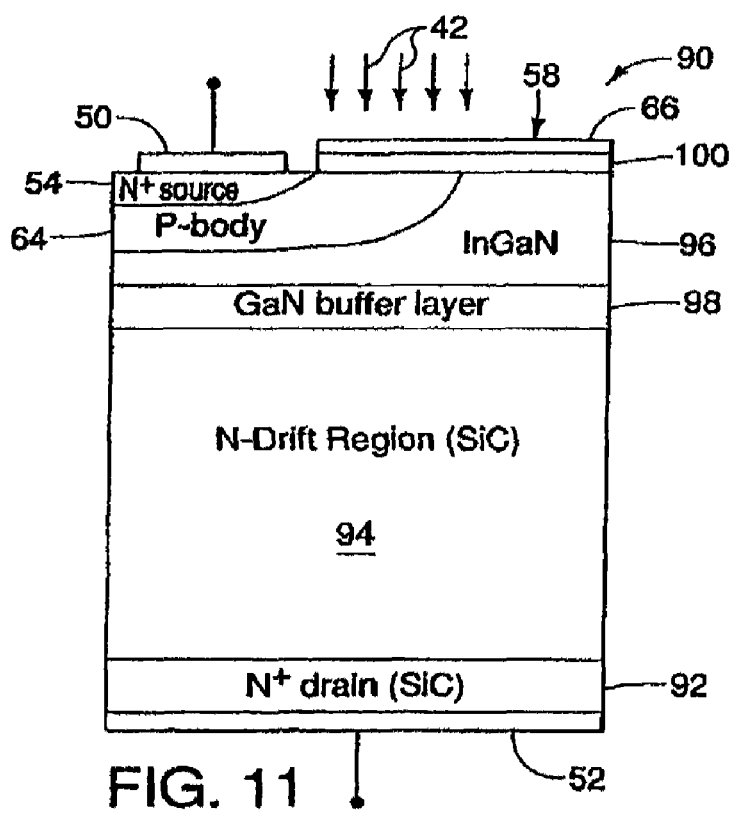
FIG. 11 shows a vertical structure power device including an InGaN optical absorption layer, a GaN buffer layer, and a GaN surface barrier layer.

FIG. 11 shows a vertical structure power device 90 in accordance with yet another embodiment of the present invention. The power device 90 includes an N$^+$ drain region 92 and an N$^-$ drift region 94, both formed of SiC. Alternatively, the N$^+$ drain region 92 may be replaced with a P$^+$ drain region. The power device 90 also includes an InGaN optical absorption layer 96 provided between a GaN buffer layer 98 and a GaN surface barrier layer 100, which is provided underneath the SiN anti-reflecting layer 66 of the optical window 58. The buffer layer 98 is provided on top of the N$^+$ drift region 94, and it acts as a strain-relief layer between the SiC N$^-$ drift region and the InGaN optical absorption layer 96. The lattice dimensional difference between SiC and InGaN is such that, if directly grown on top of one another, there may be mechanical strain in the interface, which degrades device reliability and performance. The GaN lattice dimension, being approximately a mid-value between the two, helps to minimize this strain.

In the power devices 70, 80, 82 shown in FIGS. 9-11, the optical absorption layers 76, 86, 96 are made of smaller bandgap material such as InGaN or Si, and the layer forming the N⁻ drift regions 74, 84, 94 are made of wider bandgap material such as GaN or SiC. The purpose of the optical absorption layers 76, 86, 96 is to absorb optical signal of suitable wavelength (approximately 800-850 nm for Si or 1350-1550 nm for InGaN), which is transparent to the layer for the drift regions 74, 84, 94 (SiC or GaN). Therefore, the optical absorption layers 76, 86, 96 act as the optical triggering block, whereas the drift region layers 74, 84, 94 act as voltage blocking layers. If the power devices 70, 80, 90 were made entirely of the material as in the drift regions 74, 84, 94, then a shorter wavelength would have been required because of the higher bandgap of such material. Shorter wavelength light is difficult to produce in a controllable manner and to transport effectively over optical fiber. Thus, the optical absorption layers 76, 86, 96 facilitate the use of easily available longer wavelength light for triggering, while maintaining the high voltage blocking capability of the power devices 70, 80, 90 by using wide bandgap material in the drift regions 74, 84, 94.

Figure 12:
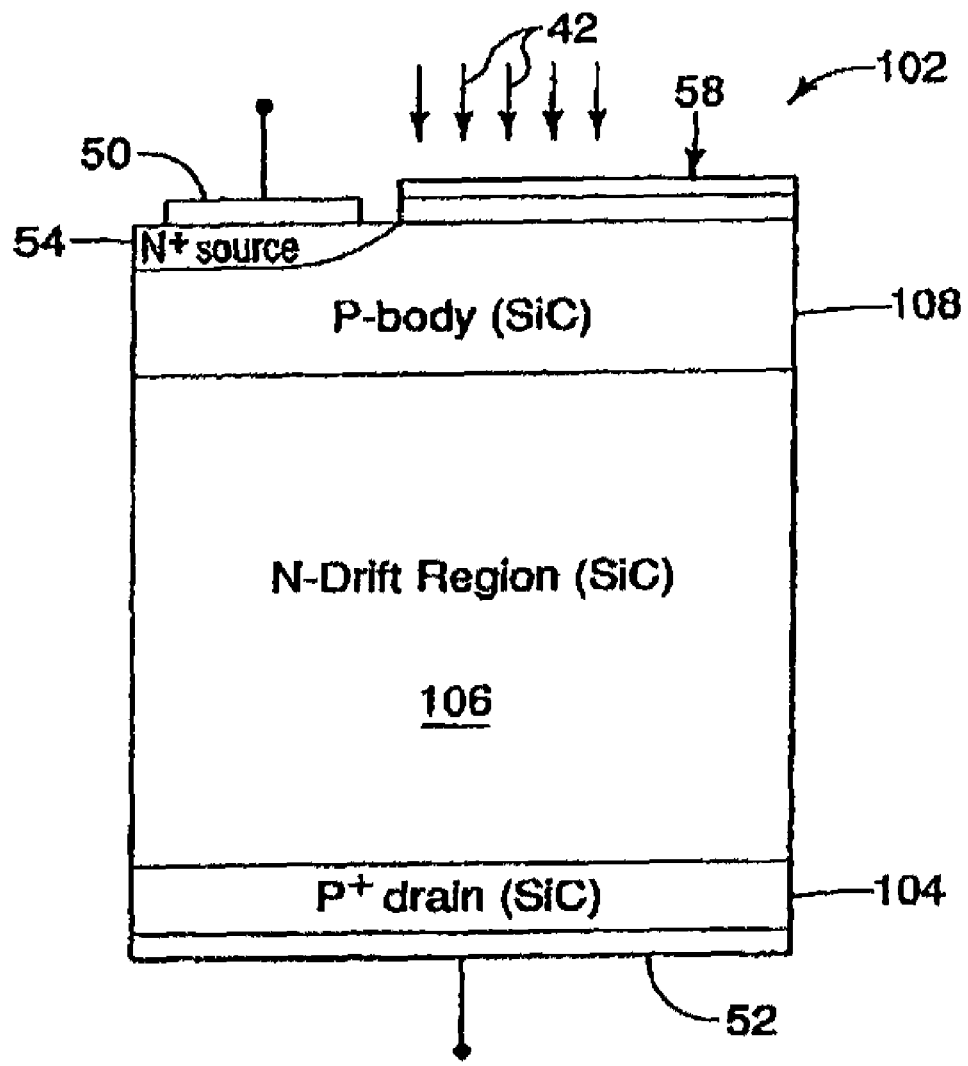
FIG. 12 shows a vertical structure power device including a $P^+$ drain region and an $N^-$ drift region formed of SiC.
Figure 13A:
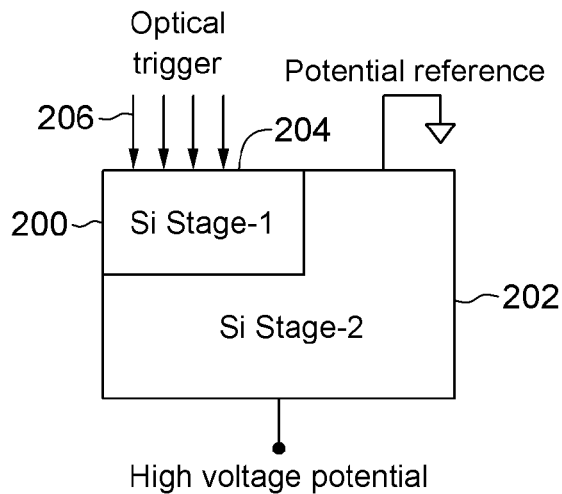
FIGS. 13A-13D show a power device including first and second monolithically integrated stages made of a common material, where the device of FIG. 13A includes Si, the device of FIG. 13B includes GaAs, the device of FIG. 13C includes SiC, and the device of FIG. 13D includes GaN.
Figure 13B:
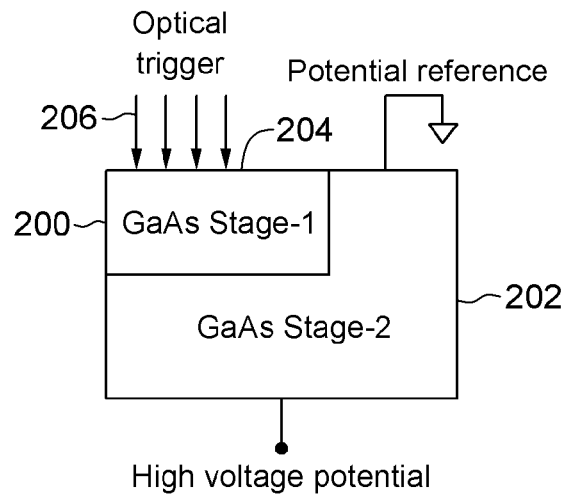
Figure 13C:
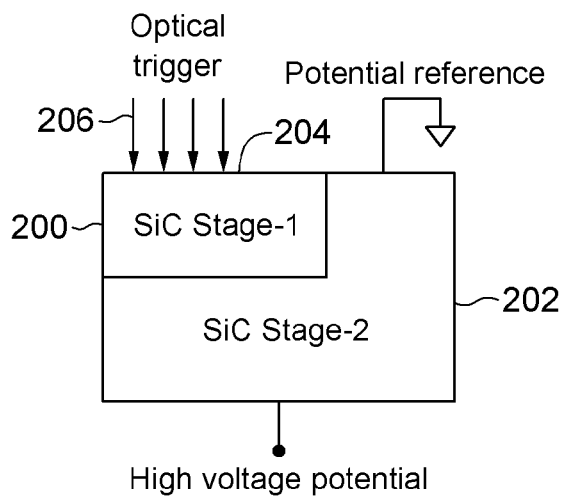
Figure 13D:
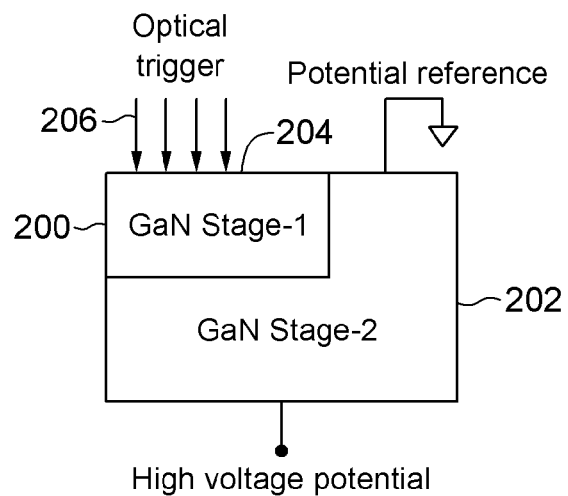

Turning now to FIG. 12, and in accordance with another embodiment of the present invention, a power device 102 has a vertical structure and includes a P⁺ drain region 104 and an N⁻ drift region 106 both formed of SiC. The power device 102 is further provided with a P-body region 108, which is also formed of SiC and extends over substantially the entire width of the power device 102.

The vertical structure optically-triggered power devices 48, 70, 80, 90, 102 described above may be implemented in an optically-triggered power transistor (OTPT) or an optically-gated bipolar transistor (OGBT).

An issue may arise with regard to integrating optical triggering into a system, whether the systems include direct optically-triggered power devices such as those described herein, or with respect to pre-existing devices. Problems of scalability may arise, for example, with respect to voltage, current, materials, and/or frequencies. As one nonlimiting example, it may be prohibitive (e.g., expensive) to provide an optically-triggered power device with an optical trigger having a short wavelength.

It would be desirable to provide a more efficient triggering device and/or a more versatile overall power system. It would also be desirable, in certain power systems, to provide a triggering device that is immune to electromagnetic effects. According to embodiments of the present invention, such a triggering device can operate as a first stage with another device as a second stage to improve scalability, and may be integrated with the second stage to provide a hybrid system or an all-optical system.

Thus, in addition to these variations in vertical or lateral embodiments, where the device has only a single stage, alternative embodiments of the present invention provide power systems including multiple stages. The multiple stages include at least a first stage and a second stage. The first stage is configured to receive an optical trigger and in turn provide an output signal for the second stage, and the second stage is configured to activate in response to the output signal from the first stage. The output signal from the first stage to the second stage may be, as nonlimiting examples, a relatively lower voltage potential signal with respect to the main power device, another optical signal (e.g., of the same or different type, of a different wavelength, etc.), or any of various other signals. If the triggering stage(s) include(s) an optical triggering device and the main power device stage(s) is/are configured to receive an optical signal, an all-optical system can be provided. Alternatively, if the main power device stage(s) is configured to operate in a manner other than optical, then a hybrid system can be provided.

In this way, a separate stage is provided to perform a trigger for any of various types or configurations of power devices, overcoming limitations of certain conventional power systems. The triggering device can be tailored to provide a suitable trigger for the main power device, in turn providing a cascading power system. The present invention is not to be limited to a single triggering stage and/or main power device stage for a particular power system, however, as multiple triggering stages and/or main power device stages and/or multiple optical triggers or output signals may be used in a single system as desired.

The power system device structure can include multiple monolithically integrated stages according to embodiments of the present invention. Such a device structure can provide, for example, a single device having both a triggering stage and a main power device. However, it is to be understood that in other embodiments, the triggering stage(s) and main power device stage(s) can be separate, as explained below.

Figure 14:
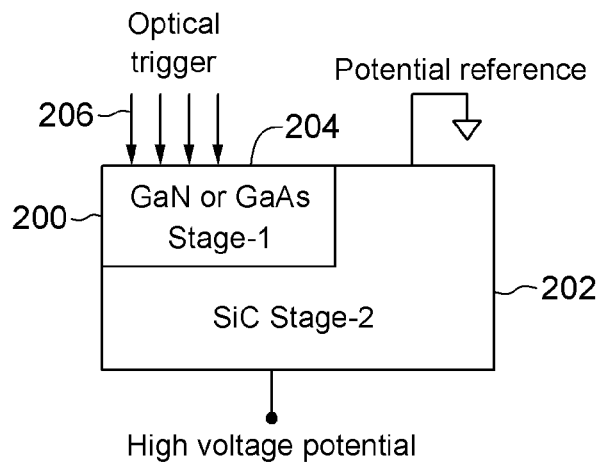
FIG. 14 shows a power device having multiple monolithically integrated stages including first and second stages of different material, respectively.
Figure 15A:
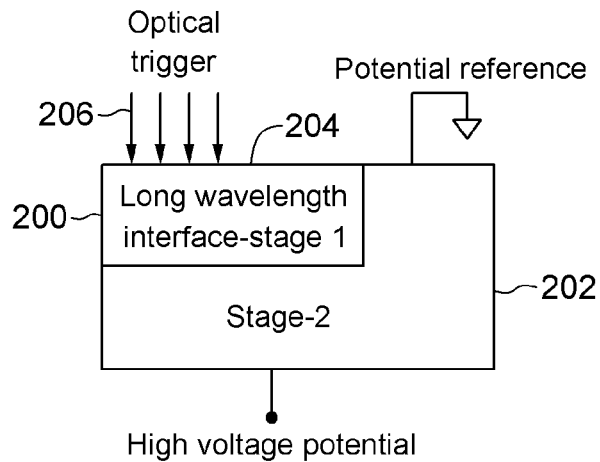
FIGS. 15A-15B show power devices having multiple monolithically integrated stages, where
Figure 15B:
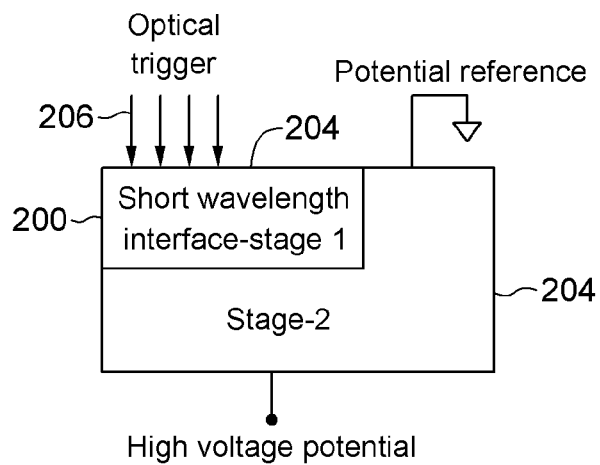

For example, given two stages, a triggering stage 200 and a main power device stage 202, several variations are possible for multiple stage power systems, such as the following, illustrated with respect to monolithically integrated stages, as nonlimiting examples:

a) Both the triggering stage 200 and the main power stage 202 could be made of the same material (for instance but not limited to Si, GaAs, SiC, GaN, etc.). Illustrations for different materials are shown in FIGS. 13A-13D.

b) The triggering stage 200 could be made of different material than the main power device stage 202 (e.g., in a two-stage cascaded device, a first input triggering stage, which directly accepts an optical signal, could be made from a direct bandgap material like GaN or GaAs, and the second or main power device stage, which may be monolithically connected to the input stage, could be made of SiC, which is an indirect bandgap material). Illustrations are shown in FIG. 14.

c) In view of b), the optical triggering interface 204 for the triggering stage 200 could be sensitive to optical sources (i.e., optical triggers 206) of different wavelengths and wavelength bands depending on the type of the optical interface material. Illustration is shown in FIGS. 15A-15B.

Figure 16A:
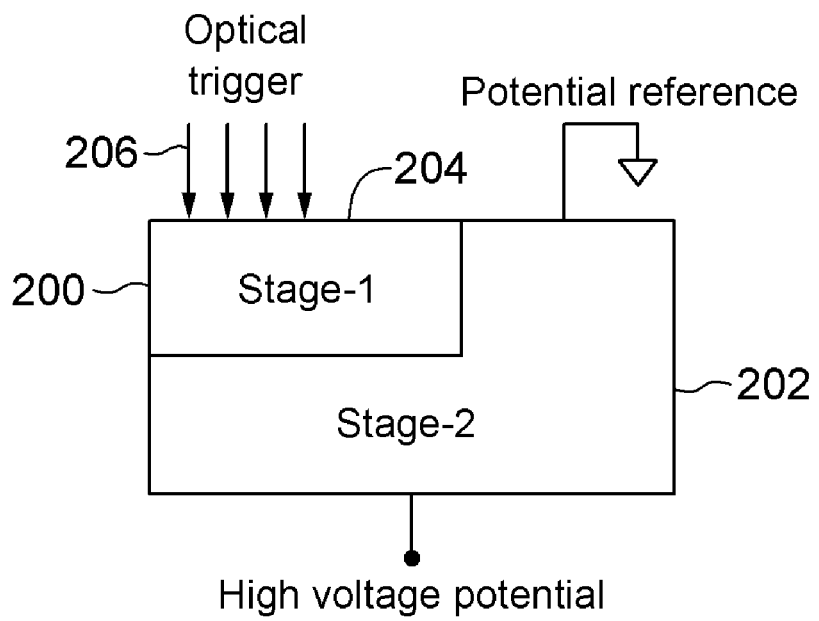
FIGS. 16A-16B show power devices having multiple monolithically integrated stages according to embodiments of the present invention, where
Figure 16B:
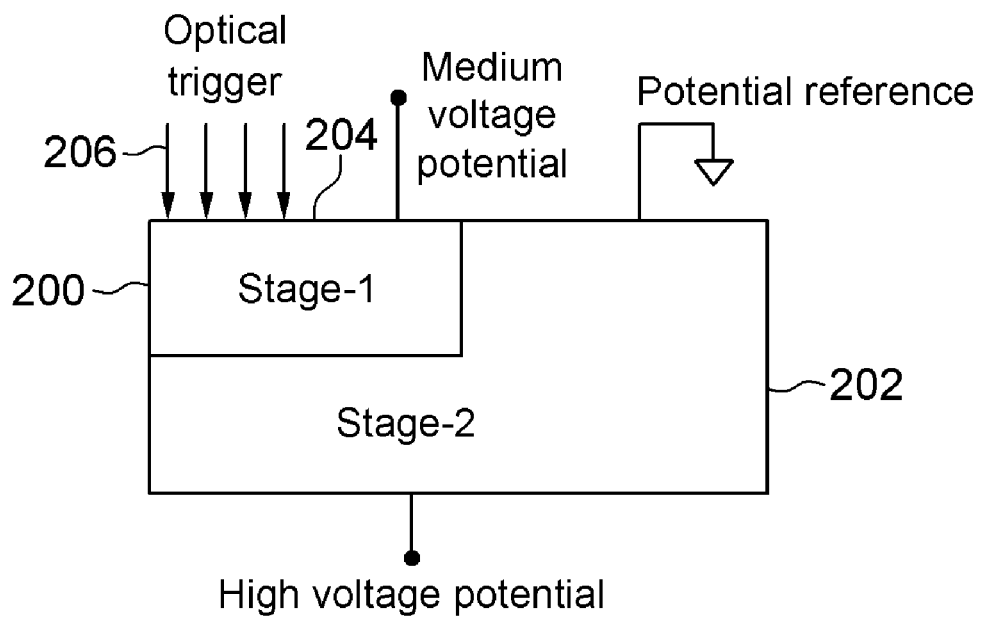

Each of these different stages 200, 202 can have the same or different voltage potential across the terminals of the device stage. Illustration is shown in FIG. 16A-16B, where the left of the figure shows a same voltage potential, while the right of the figure shows a different voltage potential.

Figure 17:
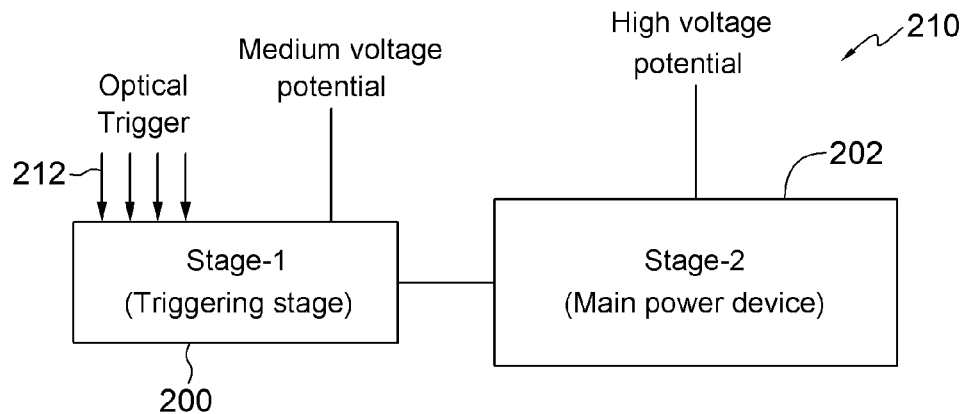
FIG. 17 shows a general multiple stage device encompassing a triggering stage and a main power device according to an embodiment of the present invention.

FIG. 17 shows a more general two-stage embodiment 210 according to the present invention, having two different voltage potentials. One can consider stage-1 as the triggering stage 200, and stage-2 as the main power device (MPD) stage 202. Stage-1 200 can be integrated with stage-2 202, as shown in FIG. 16, or it can be physically separate from but electrically (or optically) coupled to the stage-2 device. Thus, as shown in FIG. 17, an optical trigger 212 is applied to the triggering stage 200, where the first stage has a first, medium voltage potential. The electrically coupled (for example) MPD 202, having a relatively high voltage potential, operates in response. Nonlimiting examples of relative levels of voltage potential could be 5V-50V for medium voltage and 50-10, 000V for the high voltage, although this range is provided only for illustration and does not exclude other possible ranges.

Figure 18:
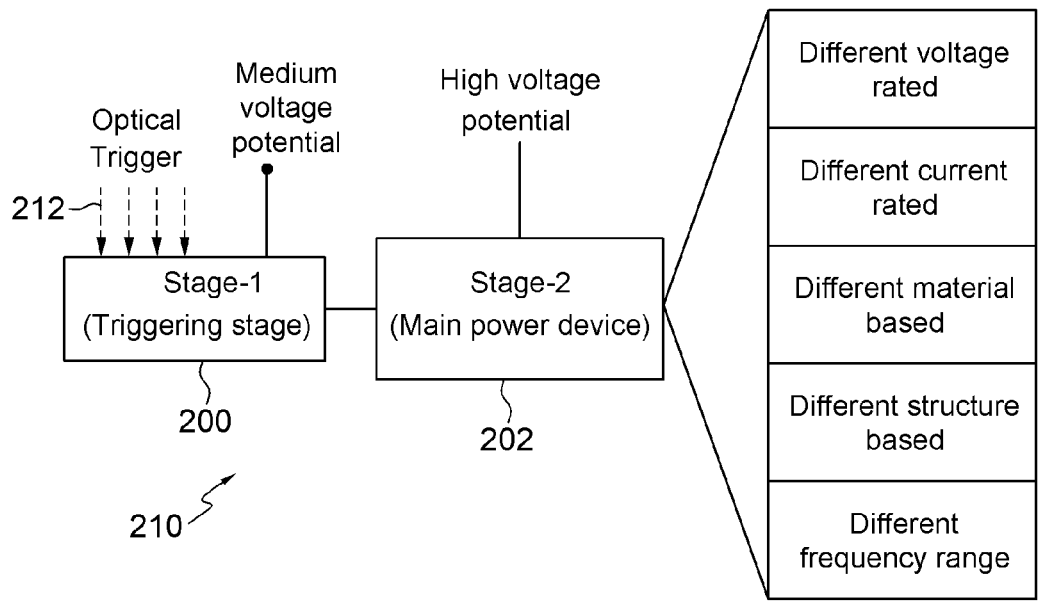
FIG. 18 shows example variations for a main power device.

FIG. 18 illustrates variations for the stage-2 device (MPD) 202 with respect to the stage-1 device 200. The MPD 202 may be, as nonlimiting examples, different voltage rated, different current rated, different material based, different structure based, and/or of a different frequency range than the triggering stage 200. In this way, the stage-1 device 200 can provide a trigger for any of various MPDs (type and/or configuration) 202 according to the design needs of one of ordinary skill in the art. It will be appreciated that the various possibilities for the MPDs 202 can provide hybrid devices, in which the stage-1 (triggering stage) device 200 triggers an MPD 202 of a different type, including pre-existing devices. It will also be appreciated that by varying one or more of the differences shown in FIG. 18, scalability of the overall system 210 can be improved.

Further, there can be various possible implementation mechanisms for the triggering stage (stage-1) 200. Two general classifications for implementation will now be described. A first implementation triggering stage 220, shown in FIG. 19, uses a single optically-activated structure 222 and a passive element (as a nonlimiting example, a resistor) 224, used for discharging the gate of the main power device 202 (during turn-off). The optically-activated structure 222 preferably is coupled directly to the main power device 202 gate. In this example implementation, the conductivity of the passive element 224 does not change. The turn-off speed of the main power device 202 depends on this conductivity and so is somewhat limited by the choice of a particular passive element.

Figure 20:
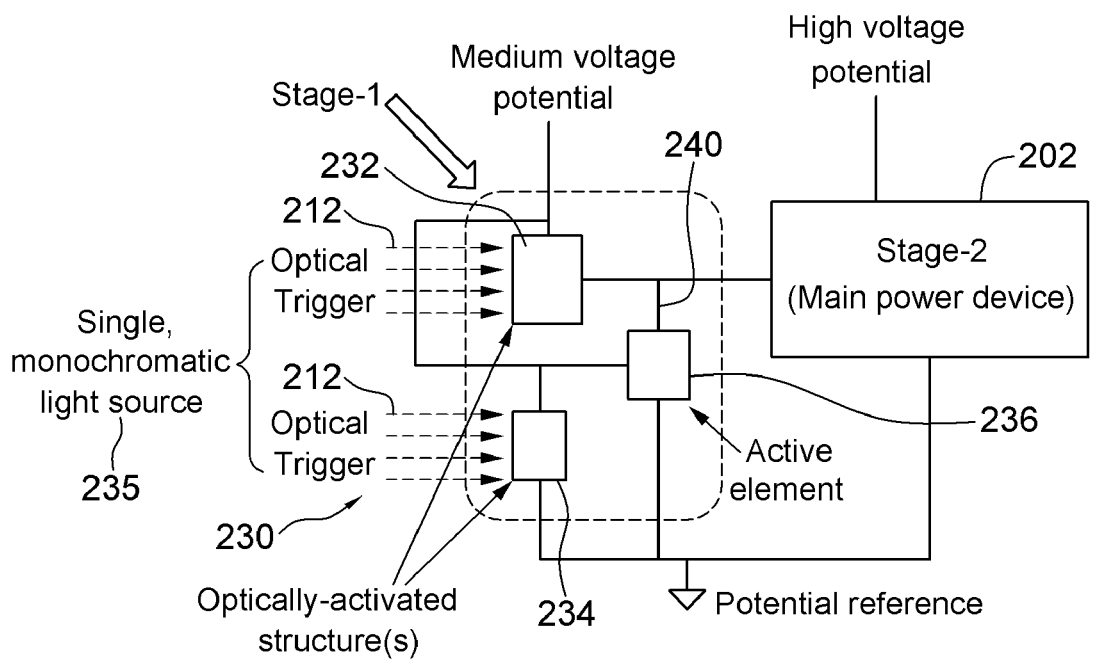
FIG. 20 shows an alternative embodiment device including a triggering stage using an active element for the turn-off phase and two optically-activated structures.

An alternative triggering stage implementation is shown in FIG. 20. A triggering stage 230 according to this implementation uses two optically-activated structures 232, 234 and one active element 236, which is used for discharging the gate of the main power device 202 (during turn-off). A top optically-activated structure 232 preferably is coupled directly to the main power device 202 gate. A bottom optically-activated structure 234 is connected between the controlling terminal of the active element 236 and the potential reference 238.

In the implementation shown in FIG. 20, the conductivity of the active element 236 switches between high and low. When light falls on the optically-activated structures 232, 234 simultaneously, such as in an example embodiment where a single, monochromatic light source 235 is used, the top optically-activated structure 232 triggers the main power device 202 to conductive state. This is the turn-on phase. At the same time, the bottom optically activated structure 234 keeps the active element 236 in off-state (that is, very high resistivity state). When the light shuts off, both of the optically-activated structures 232, 234 go to off-state, and the active element 236 goes to on-state. This increases the conductivity of the active element 236 significantly, and the main power device 202 discharges through this conductive path 240 in a rapid fashion. The turn-off speed of the main power device 202, therefore, can be higher than for the MPD shown in FIG. 19.

Figure 19:
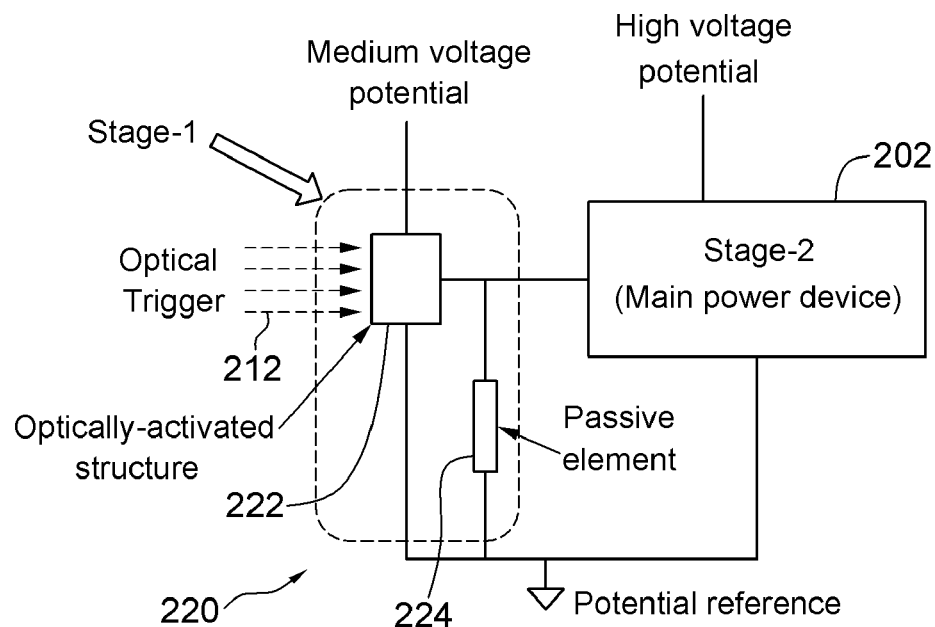
FIG. 19 shows an example device including a triggering stage using a passive element for the turn-off phase and a single optically-activated structure.

In example embodiments, the optically activated structures 222, 232, 234 for the devices 220, 230 shown in FIGS. 19 and 20 could be bipolar phototransistors whose base region will be illuminated by light. As a further example, the active element 236 in the device shown in FIG. 20 could be a metal-oxide-semiconductor field effect transistor (MOSFET) or a bipolar junction transistor (BJT).

Further, there are multiple possibilities for implementing an overall configuration for optically-activated structures 232, 234 and the active element 236 for the device 230 shown in FIG. 20. As one possibility, as shown in FIG. 20, the structures 232, 234 and active element 236 could be discrete semiconductor devices of same and/or different structures based on same and/or different material, mutually coupled by external electrical connectors. Alternatively, they could be monolithically integrated in the same semiconductor structure including uniform or different material regions.

A significant issue for particular embodiments of monolithic integration is the mutual isolation of the optically-activated structures and the active element at all phases of operation. Various general methods of electrical isolation of multiple structures in a monolithic platform will be understood by those of ordinary skill in the art. However, because of the possibility of optical penetration into the isolating regions during turn-on phase, particular consideration should be given. For example, if an optical signal generates electron-hole carriers in the isolating region, they will move under the influence of existing electric field (created by the medium voltage potential), and the neighboring structures would not remain electrically isolated.

Figure 21A:
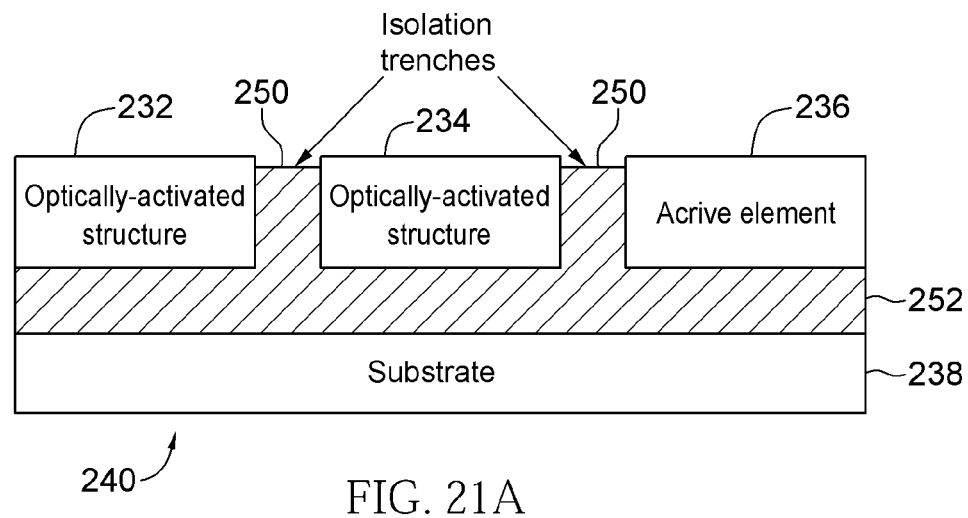
FIGS. 21A-21B show example monolithic implementation for a triggering stage according to embodiments of the present invention, where
Figure 21B:
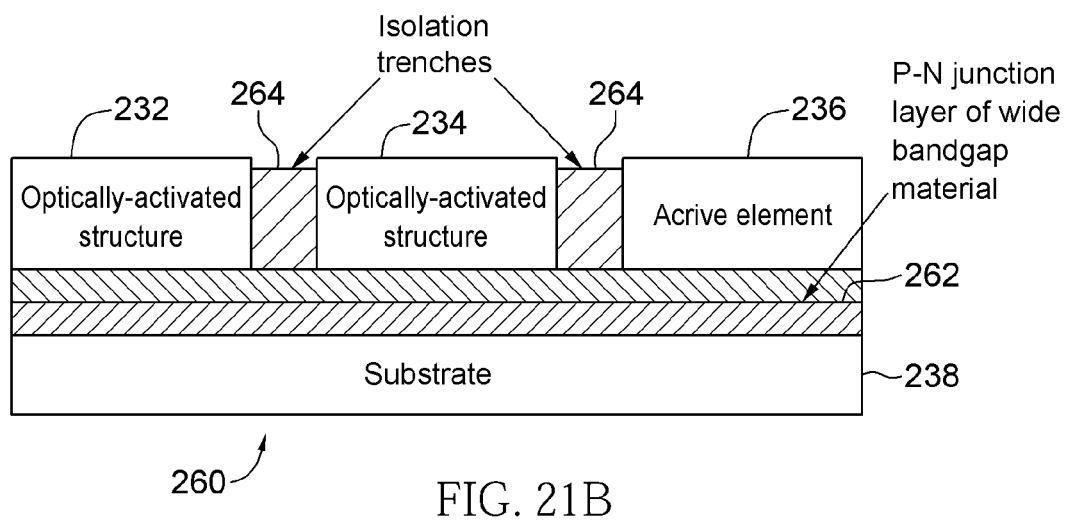

Using the triggering stage implementation shown in FIG. 20 as a nonlimiting example, two example embodiments for monolithic implementation for a triggering stage are shown in FIGS. 21A and 21B. In the monolithic implementation 240 shown in FIG. 21A, insulator-filled trenches 250 in an active semiconductor region, grown on insulator thin film 252, isolate the structures, including the optically-activated structures 232, 234 and the active element 236. As a nonlimiting example, silicon-on-insulator (SOI) with silicon dioxide filled trenches 250 may be used. In the embodiment shown in FIG. 21A, even if the optical trigger signal penetrates and generates carriers in the substrate 238, the optically-activated structures 232, 234 and the active element 236 would be mutually isolated because these photogenerated carriers cannot move through the insulator region.

In the second example monolithic implementation 260 shown in FIG. 21B, a reverse-biased P-N junction 262 is provided, made from a higher bandgap material as an isolation mechanism. Isolation trenches 264 are also provided. In this embodiment, the reverse-biased P-N junction 262, which isolates the optically-activated structures 232, 234 and the active element 236, does not generate any electrical carriers when light falls on the overall device 260, because the energy bandgap of that region would be designed for a higher value than the energy of individual photons by choosing a particular material type and composition.

The performance parameters of such devices, in their various embodiments, may include on-state drop, rise and fall time, and turn-on and turn-off delay times. These parameters can be dynamically controlled by varying the intensity, wavelength, or switching times of the optical triggering signal. In a power system operation, the overall system efficiency largely depends on the sum of the individual switch losses, which vary with the output load levels, frequency of the switching of the device, and input source (of the power system) variations. Therefore, the optical triggering parameters can be dynamically controlled depending on the system output load level so as to minimize the overall device loss and to optimize the system efficiency. Moreover, it is the rapid switching event of power devices in a power electronics system that produces fast changes in voltage and current (i.e. dv/dt and di/dt) and contributes significantly to the conducted and radiated EMI signature of the power electronics system. Because the switching dynamics of the power device can be modulated by optical trigger, the EMI signature of the power electronics system can also be controlled by varying the properties of the optical trigger.

Further embodiments of the present invention according to the above principles are now described. However, it is to be understood that the devices and systems shown are merely examples according to the present invention, and the invention is not to be limited to the particular example configurations shown and described herein. Given the various selections possible under embodiments of the present invention, combinations are possible beyond those specifically shown and described herein, and these additional combinations are considered to be within the scope of the present invention.

Figure 22A:
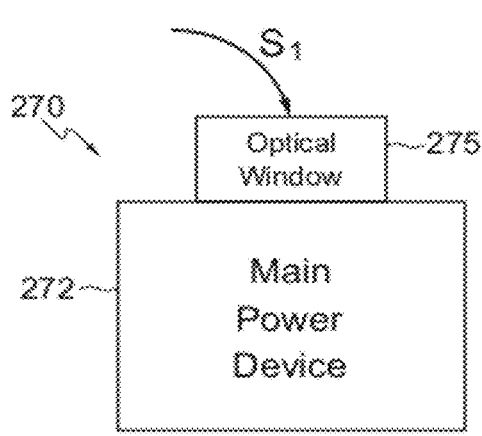
FIG. 22A shows a device, having a single fiber for providing a triggering signal to an optical window.

In a first type of embodiment, shown in FIG. 22A, a main power device (MPD) 270 includes only the main optically-triggered power device 272, which receives an optical control signal ($S_1$) through an optical window 276 and is being controlled (both turn-on and turn-off) by this signal. Specific illustrations of device structures for this embodiment are shown in FIGS. 2-11.

Figure 22B:
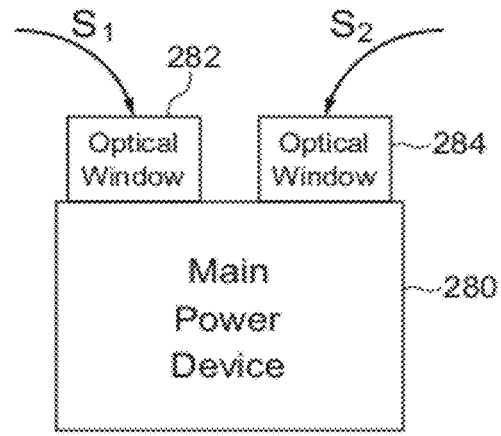
FIG. 22B shows a device, having multiple fibers for triggering and modulating signals to optical windows.

In a second type of embodiment, shown in FIG. 22B, the MPD 280 receives one optical control signal ($S_1$) for turn-on and turn-off (as with the first type of embodiment in FIG. 22A) through a first optical window 282 and a second optical signal ($S_2$) through another optical window 284. The second signal does not take part in actively controlling the device 280 connection state, but is used to dynamically modulate its electrical performance parameters, such as on-state resistance or turn-on and turn-off time. For example, the second light could be of different wavelength to excite certain trap-centers in the bandgap of the material used to fabricate the device, which modulates the recombination lifetime of the material. This results in significant changes in the device's 280 optical gain, on-state resistance, and switching speed (especially turn-off time). Another way the second optical signal can modulate the potential barrier of a particular P-N junction present in the device structure is to alter device on-state resistance or optical gain. The signals $S_1$ and $S_2$ can differ in intensity and/or wavelength.

Figure 22C:
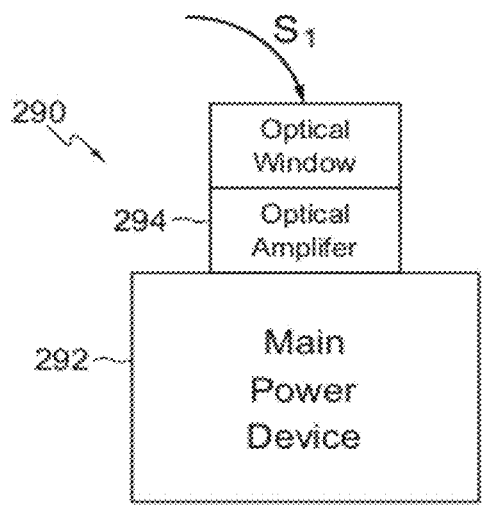
FIG. 22C shows a device integrating optical triggering operation, including an integrated optical amplifier.

In a third type of embodiment, shown by example in FIG. 22C, the overall device 290 includes, apart from the MPD 292, a triggering stage that comprises an optical amplifier structure 294, which is optically coupled to the main power device. The function of this amplifier 294 is to receive a low-intensity optical signal and amplify it to feed to the main power device 292. This way, a low optical power source (e.g., LED or low-power laser) may be used to trigger the device 290, thereby reducing the overall power electronic system cost and driver complexity.

Figure 22D:
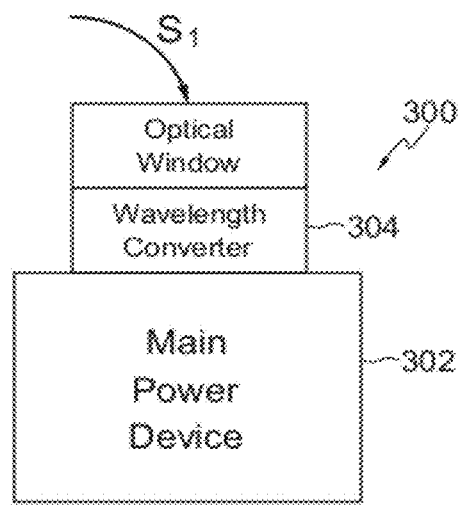
FIG. 22D shows a device integrating optical triggering operation, including an integrated wavelength converter.

In a fourth type of embodiment, shown by example in FIG. 22D, the overall device 300 includes, apart from the MPD 302, a triggering stage that comprises a wavelength converter structure 304 that is optically coupled to the main power device. The function of the amplifier 304 is to receive an optical signal of a certain wavelength and convert it to an optical signal of a different wavelength to feed to the main power device 302. This way, an optical source of, for example, industry-standard wavelength range (800-850 nm or 1350-1550 nm) can be used to directly control the main power device 302 made of wide bandgap material, such as SiC or GaN, eliminating the need to have expensive and complex short wavelength (300-400 nm) optical sources.

It will be appreciated that the fourth type of embodiment is different from the device structures shown in FIGS. 9, 10, 11, etc. The device structures in these figures include wide bandgap material and a smaller bandgap material to enable the device to be triggered by a long wavelength signal. The device, due to the presence of smaller bandgap material, absorbs long wavelength light. By contrast, the overall device 300 according to the fourth type of embodiment converts the incoming optical signal to a short wavelength, and the MPD 302 absorbs the short wavelength light.

Apart from the triggering operation, optical sensing operation can also be integrated for each power device. A sensed variable, for instance, could be voltage across the device or current through the device. The output sensed signal of this type of device is an optical signal, which travels through a fiber to reach the controller/driver stage. The variations of the fiber connection to a single device could be, for example:

a) One fiber 310 for each sensed variable of a device 312 and one for the triggering of the device. In general, there could be more than one fiber for triggering signal(s) for a device with multiple input ports, as illustrated in FIG. 22B. Illustration for a single-port device 314 is shown in FIG. 23A.

b) One integrated fiber 316 for all the sensed variables of the device and one 310 for the triggering of the device. Illustration for a single-port device 318 is shown in FIG. 23B.

c) One single fiber 320 for sensed variables as well as for the triggering 322 of the device. Illustration for a single-port device 324 is shown in FIG. 23C.

Figures 23A, 23B:
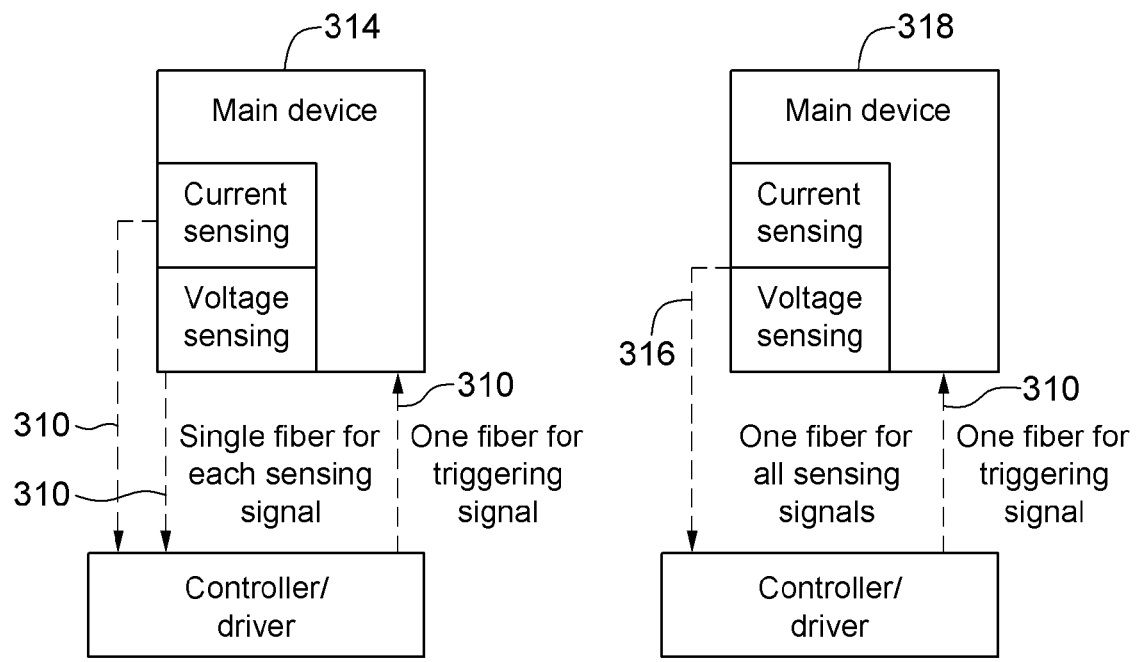
FIG. 23A shows a single-port device having one fiber for a triggering signal and a single fiber for each sensing signal.
FIG. 23B shows a device having one fiber for a triggering signal and a single fiber for all sensing signals.
Figure 23C:
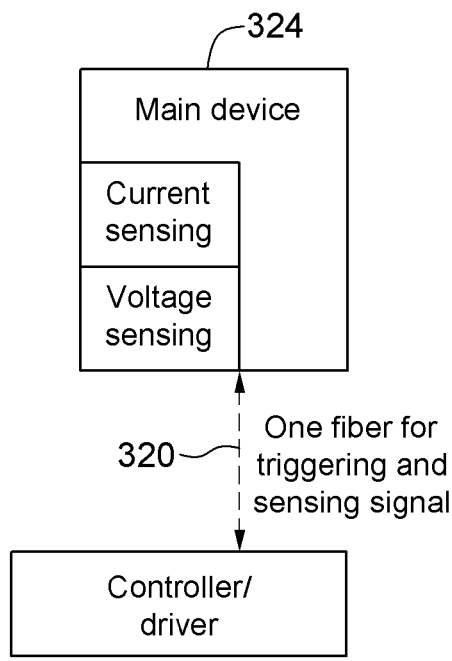
FIG. 23C shows a device having a single fiber for triggering and sensing signals.
Figure 24:
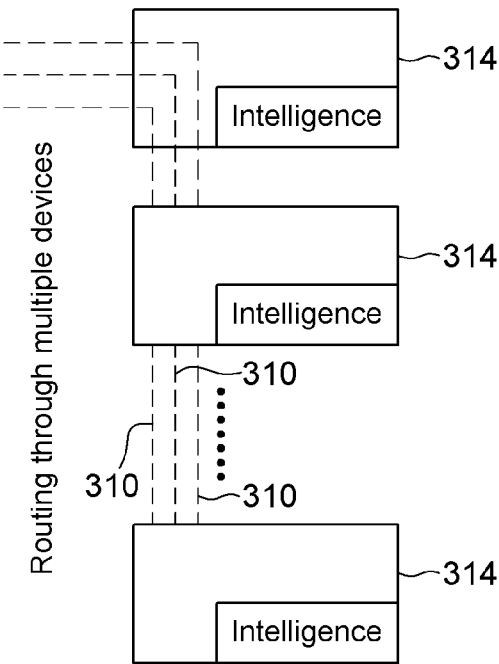
FIG. 24 illustrates an optical signal routing layout for the device of FIG. 23A including three fibers (one for sensing voltage, one for sensing current, and one for triggering)
Figure 25:
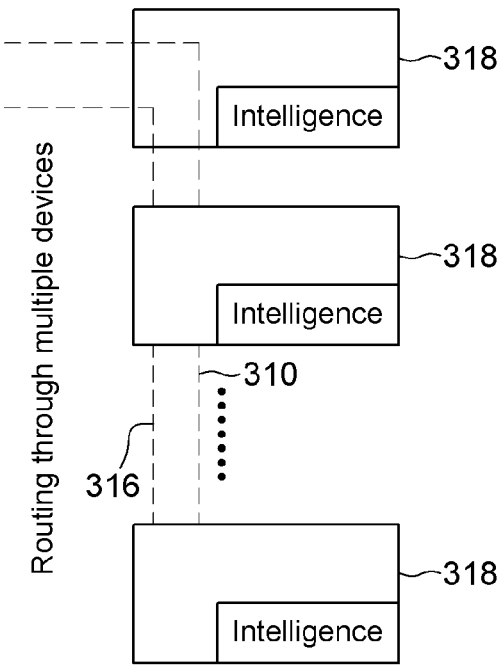
FIG. 25 illustrates an optical signal routing layout for the device of FIG. 23B including two fibers (one for sensing voltage and current and one for triggering)
Figure 26:
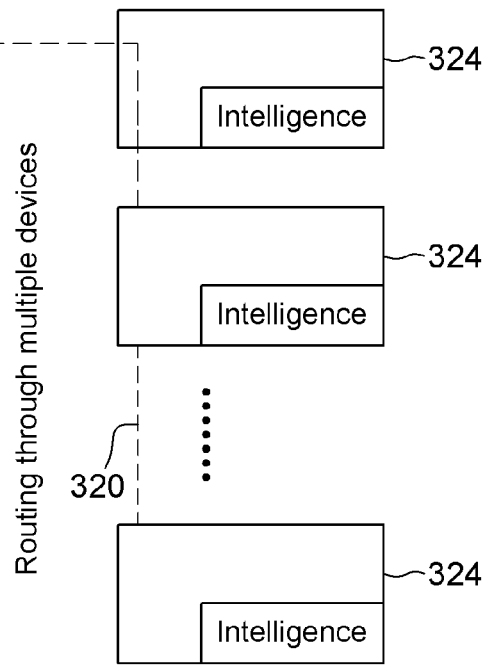
FIG. 26 illustrates an optical signal routing layout for the device of FIG. 23C including a single fiber (for sensing and triggering)

In a power system, including multiple devices, for any of the three mechanisms 314, 318, 324 in FIGS. 23A-23C, routing of the optical signal can be accomplished through multiple devices. Individual devices may, for example, have built-in intelligence that can identify whether a particular optical triggering/sensing signal is intended or generated for/by itself or some other device, and depending on that identification route the signal through the entire switch network of the power system. Illustrations of routing of the optical signals for all three mechanisms 314, 318, 324 are shown in FIGS. 24-26. FIG. 24 shows the routing for the device 314 corresponding to the case of FIG. 23A, where three fibers 310 are used, two for sensing voltage and current and one for triggering. FIG. 25 shows the routing for the device 318 corresponding to the case of FIG. 23B, where two fibers are used, one 316 for sensing voltage and current in an integrated manner and the other one 310 for triggering. FIG. 26 shows the routing for the device 324 corresponding to the case of FIG. 23C, where only one fiber 320 is used for sensing as well as for triggering.

Figure 27:
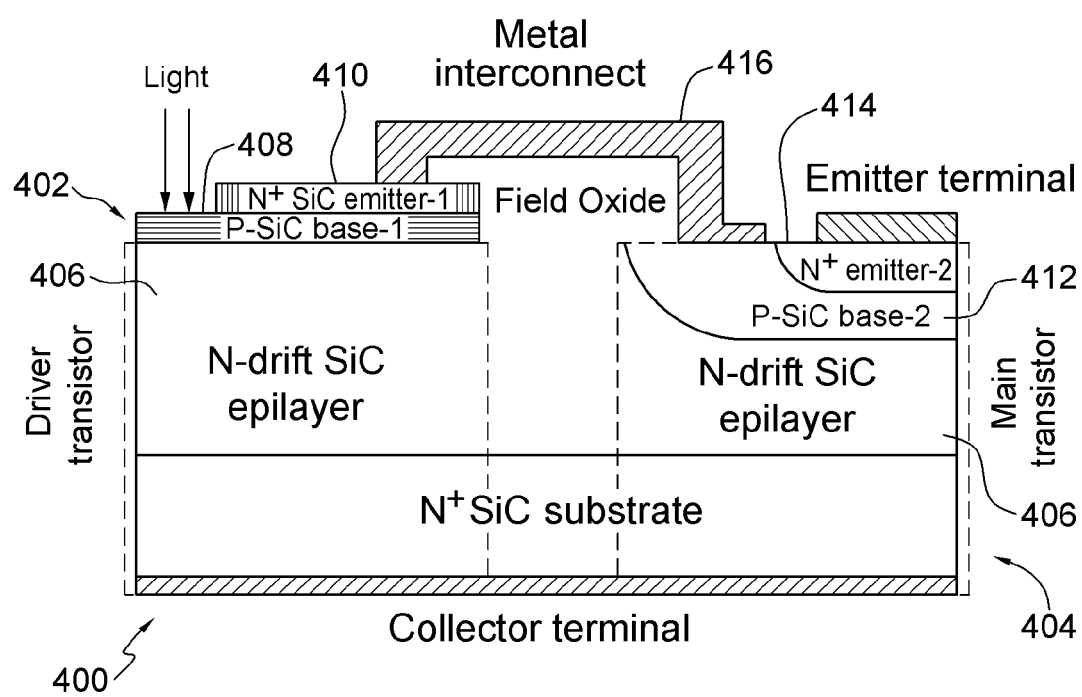
FIG. 27 illustrates an SiC based optically-gated high-power solid state switch (SiC-OGHSS) structure, according to another embodiment of the present invention.

FIG. 27 shows an SiC-based optically-gated high power solid state switch (SiC-OGHSS) structure 400 according to another embodiment of the present invention. The SiC-OGHSS structure 400 includes a cascaded arrangement of two BJT structures 402, 404 with a common N-drift region 406 acting as the wide collector. The driver transistor 402 on the left in FIG. 27 includes a P-base 408 and an $N^+$ emitter region 410, which are grown on the drift region 406, whereas the base 412 and the emitter 414 of the main transistor 404 are implanted into the drift region. The emitter 410 of the driver 402 is connected to the base 412 of the main transistor 404 by an internal metallization 416.

Figure 28:
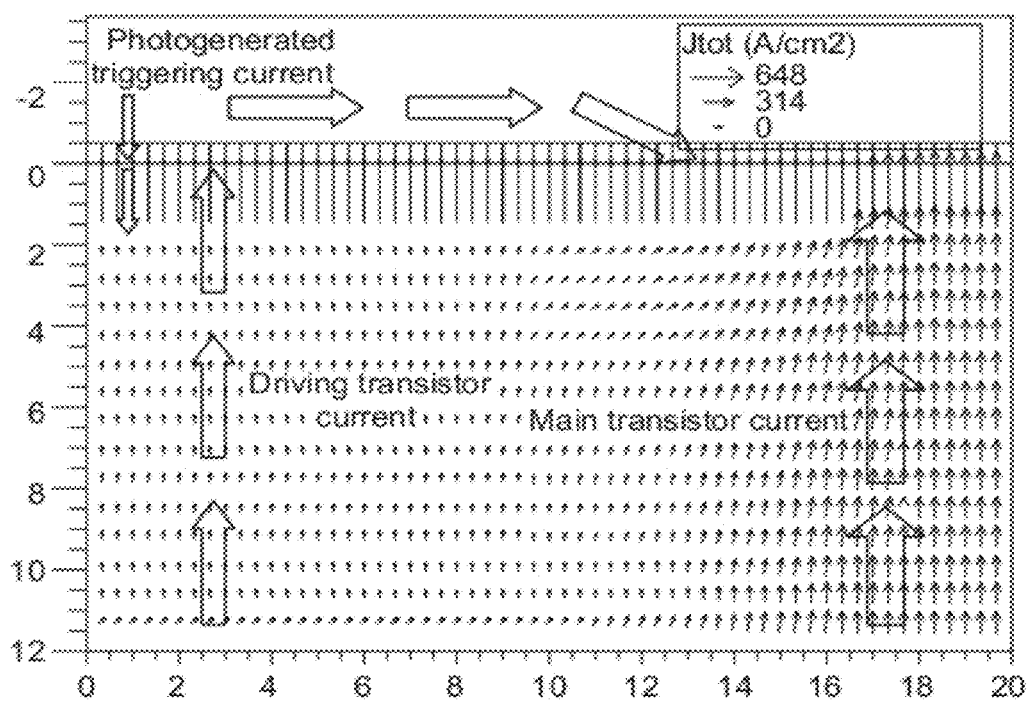
FIG. 28 illustrates carrier dynamics of the device of FIG. 27.

As illustrated in FIG. 28, when light falls on the base region 412 of the driver transistor 402, optical power is absorbed to generate electron-hole pairs. The holes provide the base drive for the driver transistor 402, which turns on given a positive potential difference between collector and emitter terminals. Subsequently, the main transistor 404, supplied with the required base drive by the current flowing through the driver transistor 402, turns on to carry the bulk of the total device current. In the absence of light, carriers in the driver base region 408 recombine, and consequently the main transistor 404 shuts off because its base drive is withdrawn.

Cascaded devices operate at a slower speed compared to single devices, but keeping in view the requirement of moderate switching speeds, the cascaded structure is advantageous for significantly reducing the triggering optical power requirement owing to its high electrical gain. Higher gain of the two individual transistors is enhanced in an example embodiment by employing a wide-collector design to support the forward voltage. In the blocking state the depletion layer primarily extends into the low-doped drift region acting as a collector. This allows the transistor base regions to be thin and achieve a higher gain. Using wide bandgap SiC as the material, for example, this device structure achieves high breakdown voltage capability with a smaller drift thickness than what would be required for traditional pulsed-power optical switch material, such as Si or GaAs. This lowers the conduction loss and increases the electrical efficiency of the device.

Figure 30A:
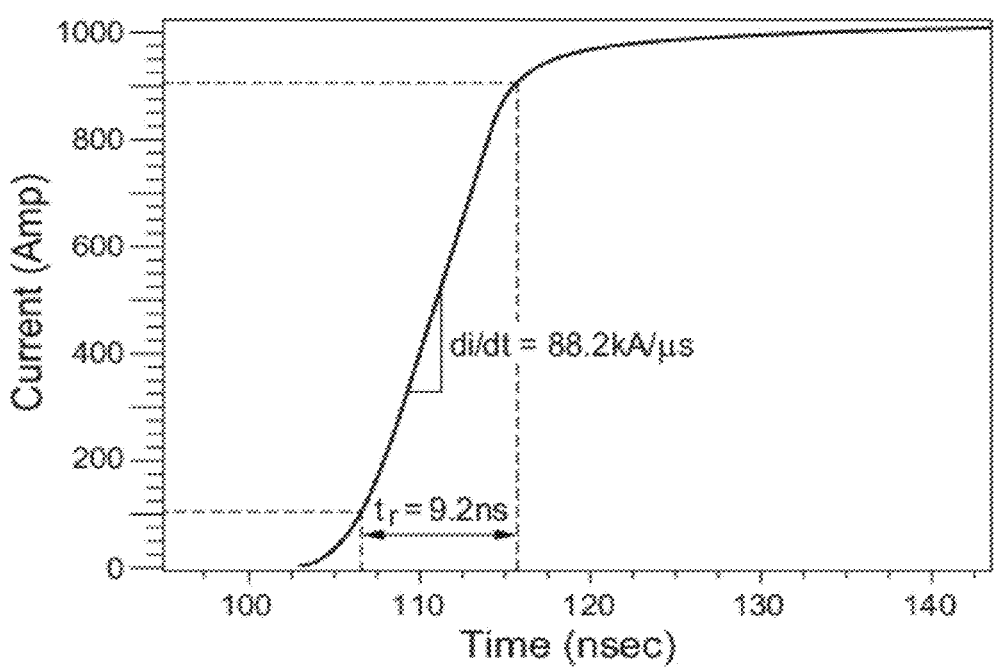
FIG. 30A illustrates turn-on pulses of the device of FIG. 27.
Figure 29:
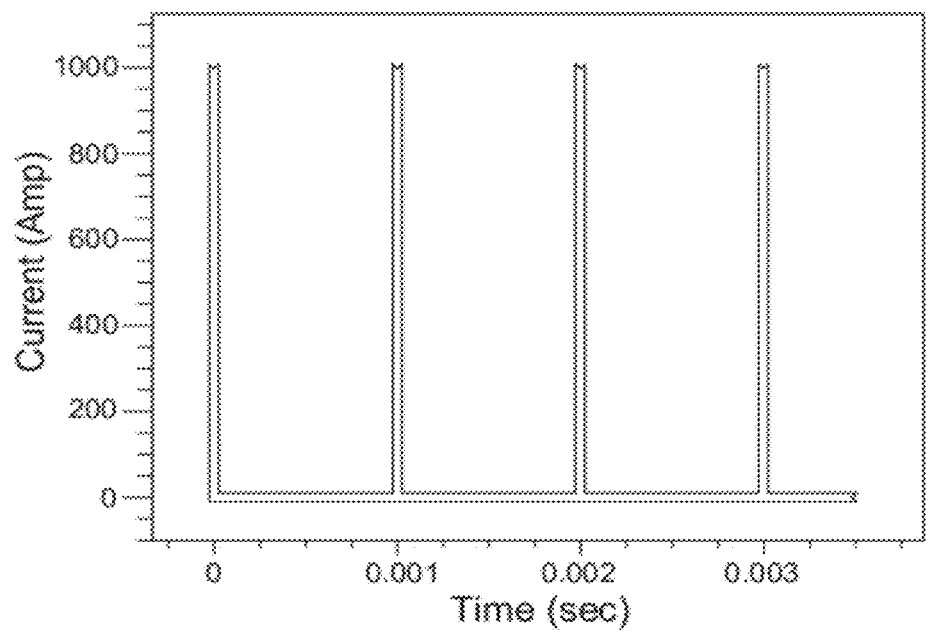
FIG. 29 illustrates 1 kA pulsed power operation at 1 kHz for the device of FIG. 27.
Figure 30B:
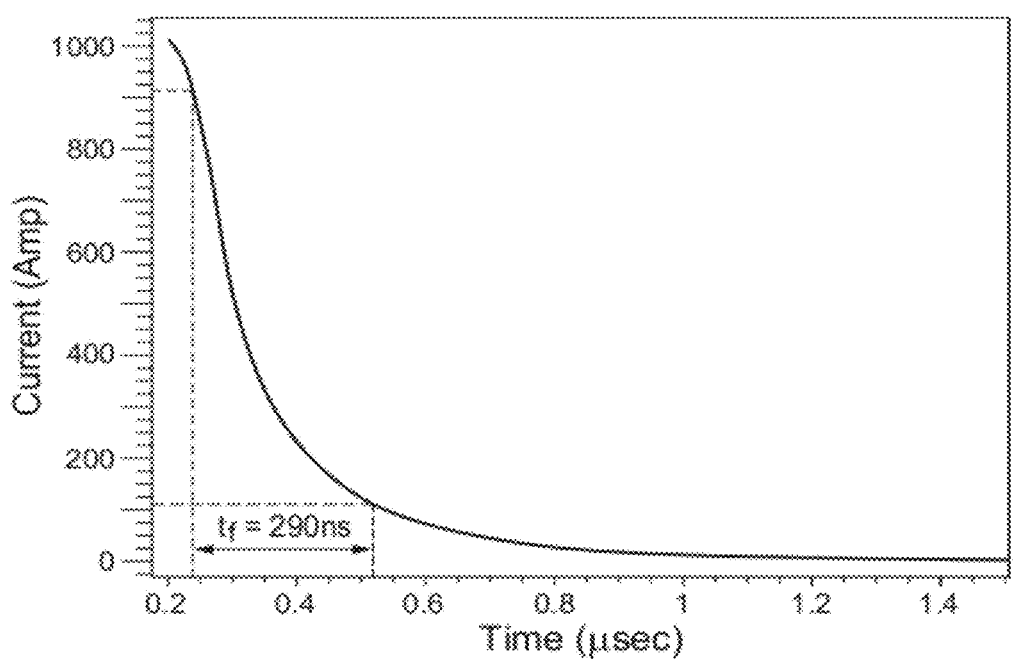
FIG. 30B illustrates turn-off pulses of the device of FIG. 27.

The example SiC-OGHSS 400 was simulated to generate 1 kA pulses, while blocking 1 kV in the off-state, at a repetition rate of 1 kHz triggered by a 100 W (100 ns pulse of 350 nm wavelength) optical power drive as shown in FIG. 29. FIG. 30A illustrates the turn-on phase of the device 400, which attains the peak current value at a fairly high di/dt rate of 88.2 kA/µs, requiring 9.2 ns of turn-on time. The turn-off is 290 ns because the natural recombination process of the excess minority carriers inside the device takes more time. The turn-off time period is depicted in FIG. 30B.

Table 1 presents the switching and the conduction losses associated with the device 400 operating at 1 kHz with a duty cycle of 0.1% for a peak current of 1 kA. A major portion of the overall loss is attributed to the turn-off losses, as expected considering the above-described switching performance of the device 400.

TABLE 1

Loss components of SiC-OGHSS

| Type of Loss | | (Watts) |
|---|---|---|
| Conduction loss | | 8.70 |
| Turn-on loss | | 7.87 |
| Turn-off Loss | Loss till current drops to 10% | 65.60 |
| | Loss due to tail-current | 38.00 |

An example SiC-OGHSS 400 provides one or more, and preferably all, of the following features/benefits:

1) Low-resistivity 4H—SiC N+ substrate: An N+ substrate of 4H polytype is used for the SiC-OGHSS. This is governed by the rationale of a) commercial availability of low-resistivity N+ substrate as compared to highly resistive P+ substrate, b) low resistivity of 4H—SiC substrate compared to 6H—SiC substrate, and c) higher ambipolar mobility in the drift region for 4H—SiC compared to 6H—SiC.

2) Lower probability of electron-induced avalanche breakdown: For 4H—SiC, although the electron mobility is much higher compared to hole, quite unexpectedly the impact ionization coefficient is lower for electrons. Hence, due to optically-initiated conductivity modulation, governed by electrons, SiC-OGHSS exhibits lower probability of avalanche breakdown because of low impact ionization rate of the electrons.

3) Higher quality of emitter ohmic contact: One of the main challenges in the fabrication of SiC power devices is high quality ohmic contact to P-type material. Good P-type contacts are formed by annealing platinum above 1000° C. on 4H—SiC. However, conventional electrically-triggered IGBT faces the problem of degradation of MOS gate characteristic upon exposing the wafer above 900° C. This limitation can be circumvented in the SiC-OGHSS 400 because of optical gate structure, which does not need any physical electrode or gate oxide.

4) Vertical photogenerated channel or optical trench: Existing art highlights the advantage of using a trench-gate structure instead of a conventional planar gate structure. Although the trench-gate entails shorter electron bypass length and higher cell density per unit chip area, its main disadvantage is the high localized electric field at the corners of the trench bottom. The SiC-OGHSS 400 emulates the trench-gate structure by creating a vertical photogenerated channel but does not limit the breakdown-voltage capability of the device by creating any localized high electric field. This also allows the use of epitaxial growth technique to realize P-base (for the driver structure) as compared to deep implantation (requiring very high temperature prolonged anneal) required for a planar gate structure.

5) System-level benefits of SiC-OGHSS based systems: a) Improved Gate Isolation—there is complete isolation between the gate driver and the device (and hence, the power stage). As such, very high di/dt and dv/dt have no impact on SiC-OGHSS; b) Simple Design—for two- and higher-level ET switching converters, different designs of low- and high-side drivers are required. For a SiC-OGHSS based converter, the designs of high- and low-side drivers remain the same, leading to simplicity of overall design, enhanced reliability of the system and monolithic integration; c) Higher Switching Frequency—as the switching frequency of an ETD increases, parasitic oscillations may be induced in the driver circuit owing to coupling effects between the device capacitance and the parasitic inductance of the gate connection and also due to transmission-line effects. With an OGHSS, such possibilities do not arise; d) Higher Reliability—the SiC-OGHSS based power system does not suffer from gate-driver failure due to short-circuiting; and e) Increased Integration—optical switching enhances the possibility of system integration by mitigating electromagnetic interference effects.

While various embodiments of the present invention have been shown and described, it should be understood that other modifications, substitutions, and alternatives are apparent to one of ordinary skill in the art. Such modifications, substitutions, and alternatives can be made without departing from the spirit and scope of the invention, which should be determined from the appended claims.

Various features of the invention are set forth in the appended claims.

What is claimed is:

1. An optically-triggered power system comprising:
at least one triggering stage responsive to at least one optical trigger to directly create photogeneration of carriers in the at least one triggering stage and thus generate at least one output signal;
at least one power device coupled to and monolithically integrated with said at least one triggering stage and responsive to said at least one generated output signal to activate said at least one power device.

2. The power system of claim 1, wherein said at least one triggering stage has a different voltage rating than said at least one power device.

3. The power system of claim 1, wherein said at least one triggering stage has a different current rating than said at least one power device.

4. The power system of claim 1, wherein said at least one triggering stage is made of a different material than said at least one power device.

5. The power system of claim 1, wherein said at least one generated output signal comprises an optical signal having a different frequency and/or amplitude than the at least one optical trigger.

6. The power system of claim 1, wherein said at least one output signal is a non-optical signal.

7. The power system of claim 1, wherein said at least one triggering stage comprises a plurality of triggering stages, wherein said at least one power device comprises a plurality of power devices, and wherein said plurality of triggering stages and said and said plurality of power devices are monolithically integrated into a single device.

8. The power system of claim 1, wherein said at least one triggering stage comprises:
at least one optically-activated structure for receiving the at least one optical trigger and generating the at least one output signal, wherein said optically-activated structure is coupled to a gate of said at least one power device;
at least one passive element for discharging said gate.

9. The power system of claim 1, wherein said at least one triggering stage comprises:
an active element configured to switch between an on-state and an off-state, wherein the off-state is a higher resistivity state than the on-state;
a plurality of optically-activated structures for receiving the at least one optical trigger, wherein one of the optically-activated structures is configured to generate the at least one output signal and is coupled to a gate of said power device;
wherein another of the optically-activated structures is configured when exposed to said at least one optical trigger to keep said active element in an off-state and when not exposed to said at least one optical trigger to put said active element in an on-state;
wherein said active element is disposed so that said at least one power device discharges via said active element when said active element is in the on-state.

10. The power system of claim 9, wherein said active element and said plurality of optically-activated structures of said at least one triggering stage are monolithically integrated in a semiconductor structure.

11. The power system of claim 10, wherein said active element and said plurality of optically-activated structures of said at least one triggering stage are respectively separated from one another by an insulator.

12. The power system of claim 11, wherein said at least one triggering stage further comprises:
a reverse-biased P-N junction, said active element, said plurality of optically-activated structures, and said insulator being disposed on said reverse-biased P-N junction.

13. The power system of claim 1, wherein said at least one triggering stage comprises an optical amplifier, said optical amplifier receiving said at least one optical trigger and generating at least one optical output signal of a higher intensity than said at least one optical trigger.

14. The power system of claim 1, wherein said at least one triggering stage comprises a wavelength converter, said wavelength converter receiving said at least one optical trigger and generating at least one optical output signal of a different wavelength.

15. A monolithically integrated or hybrid packaged power device comprising:
at least one triggering stage responsive to at least one optical trigger to directly create photogeneration of carriers in the at least one triggering stage and thus generate at least one output signal;
at least one main power device coupled to said at least one triggering stage and responsive to said at least one generated output signal to activate said at least one power device;
wherein said at least one triggering stage and said at least one main power device are monolithically integrated into the power device.

16. The power device of claim 15, wherein said at least one triggering stage and said at least one main power device are made of different materials.

17. The power device of claim 15, wherein said at least one triggering stage is made from a direct bandgap material, and wherein said at least one main power device is made from an indirect bandgap material.

18. The power device of claim 15, wherein said at least one optical trigger has a first wavelength, and wherein the at least one output signal comprises an optical signal having a second wavelength.

19. The power device of claim 15, wherein each of said at least one triggering stage comprises a single optical window for receiving the at least one optical trigger.

20. The power device of claim 15, wherein each of said at least one triggering stage comprises at least two optical windows for receiving at least the at least one optical trigger and produces a second optical signal;
wherein said second optical signal modulates the power device.

21. The power device of claim 15, further comprising:
at least one optical sensor for sensing at least one of voltage and current across the power device and generating an optical output sensed signal; and
at least one controller for receiving said optical output sensed signal and generating the at least one optical trigger.

22. The power device of claim 21, wherein said generated optical output sensed signal is delivered over at least one optical fiber, and wherein the at least one optical trigger is delivered over an optical fiber other than the at least one optical fiber.

23. The power device of claim 22, wherein said at least one generated output signal comprises a plurality of sensing signals, and wherein the at least one optical fiber comprises one optical fiber for each of the plurality of sensing signals.

24. The power device of claim 21, wherein said generated optical output sensed signal and said at least one optical trigger are delivered over a single optical fiber.

25. The power device of claim 15
wherein the monolithically integrated power device is one of a plurality of power devices, and further comprising:
at least one processor configured to receive the optical trigger, determine which of the plurality of power devices is a target of the optical trigger, and route the optical trigger to the target;
at least one optical fiber for delivering the at least one optical trigger to the target.

26. A method of optically activating a power device, the method comprising:
receiving at least one optical trigger in at least one triggering stage to directly create photogeneration of carriers in the at least one triggering stage and thus generate at least one output signal;
receiving the at least one output signal by at least one power device monolithically integrated with the at least one triggering stage;
activate said at least one power device in response to said at least one received output signal.

27. The method of claim 26, wherein the at least one output signal comprises an optical signal having a different wavelength than said at least one received optical trigger.

28. The method of claim 26, wherein the at least one triggering stage has a smaller voltage rating than the at least one power device.

29. The method of claim 26, wherein the at least one output signal comprises a non-optical signal.

30. The method of claim 26, further comprising:
modulating at least one of switching dynamics and steady-state properties of the power device by varying intensity, wavelength and switching properties of the at least one optical trigger.

31. An optically-triggered power system comprising:
a plurality of triggering stages, at least one of the plurality of triggering stages being responsive to at least one optical signal to directly create photogeneration of carriers in the at least one triggering stage and thus generate at least one output signal;
a plurality of power devices monolithically integrated with said plurality of triggering stages, at least one of the power devices being coupled to the at least one of the plurality of triggering stages and responsive to the at least one generated output signal to activate the at least one power device.

32. The power system of claim 31, wherein said plurality of triggering stages and said plurality of power devices are arranged in an array.

33. An array of power systems as defined in claim 32.

34. The array of power systems of claim 33, wherein the array of power systems is fed by at least one external optical triggering signal.

35. The array of power systems of claim 34, wherein the least one external optical triggering signal modulates at least one of switching dynamics and steady-state properties of the plurality of power devices by varying at least one of intensity, wavelength and switching properties of the at least one optical triggering signal.

* * * * *

UNITED STATES PATENT AND TRADEMARK OFFICE
CERTIFICATE OF CORRECTION

PATENT NO. : 8,294,078 B2
APPLICATION NO. : 12/157694
DATED : October 23, 2012
INVENTOR(S) : Mazumder et al.

It is certified that error appears in the above-identified patent and that said Letters Patent is hereby corrected as shown below:

In the Claims:

Col. 19, line 5, Claim 7    Please delete the second occurrence of "and said".

Signed and Sealed this
Ninth Day of July, 2013

Teresa Stanek Rea
*Acting Director of the United States Patent and Trademark Office*